(12) United States Patent
Lin et al.

(10) Patent No.: US 12,051,663 B2
(45) Date of Patent: Jul. 30, 2024

(54) MEMORY DEVICES AND METHODS OF FORMING THE SAME

(71) Applicant: Taiwan Semiconductor Manufacturing Company, Ltd., Hsinchu (TW)

(72) Inventors: Meng-Han Lin, Hsinchu (TW); Sai-Hooi Yeong, Hsinchu County (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 42 days.

(21) Appl. No.: 17/344,946

(22) Filed: Jun. 11, 2021

(65) Prior Publication Data

US 2022/0230976 A1    Jul. 21, 2022

Related U.S. Application Data

(60) Provisional application No. 63/137,757, filed on Jan. 15, 2021.

(51) Int. Cl.
| | |
|---|---|
| *H01L 25/065* | (2023.01) |
| *H01L 23/00* | (2006.01) |
| *H01L 25/00* | (2006.01) |
| *H01L 25/18* | (2023.01) |

(52) U.S. Cl.
CPC ............ *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/1441* (2013.01)

(58) Field of Classification Search
CPC ..... H01L 24/08; H01L 25/0657; H01L 25/18; H01L 2224/08145; H01L 2224/80895; H01L 2224/80896; H01L 2924/1431; H01L 2924/1441

See application file for complete search history.

(56) References Cited

U.S. PATENT DOCUMENTS

| | | | |
|---|---|---|---|
| 2020/0027509 A1* | 1/2020 | Chen | H01L 24/08 |
| 2020/0144242 A1* | 5/2020 | Park | H10B 41/50 |
| 2020/0203364 A1* | 6/2020 | Totoki | H01L 27/0688 |
| 2020/0335487 A1* | 10/2020 | Rajashekhar | H01L 24/32 |
| 2021/0066282 A1* | 3/2021 | Kim | H01L 25/18 |
| 2021/0082865 A1* | 3/2021 | Baraskar | H01L 25/0657 |
| 2021/0407980 A1* | 12/2021 | Young | H10B 51/40 |

* cited by examiner

*Primary Examiner* — Thanh Y. Tran
(74) *Attorney, Agent, or Firm* — JCIPRNET

(57) ABSTRACT

A memory device includes a staircase structure, a plurality of first conductive contacts, a plurality of first drivers and a plurality of second conductive contacts. The staircase structure includes a plurality of first conductive lines and a plurality of first dielectric layers stacked alternately. The first conductive contacts are electrically connected to the plurality of first conductive lines respectively. The second conductive contacts are electrically connected to the plurality of first drivers respectively. The plurality of first conductive contacts and the plurality of second conductive contacts are bonded and disposed between the plurality of first conductive lines and the plurality of first drivers.

20 Claims, 30 Drawing Sheets

MEMORY DEVICES AND METHODS OF FORMING THE SAME

CROSS-REFERENCE TO RELATED APPLICATION

This application claims the priority benefit of U.S. provisional application Ser. No. 63/137,757, filed on Jan. 15, 2021. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
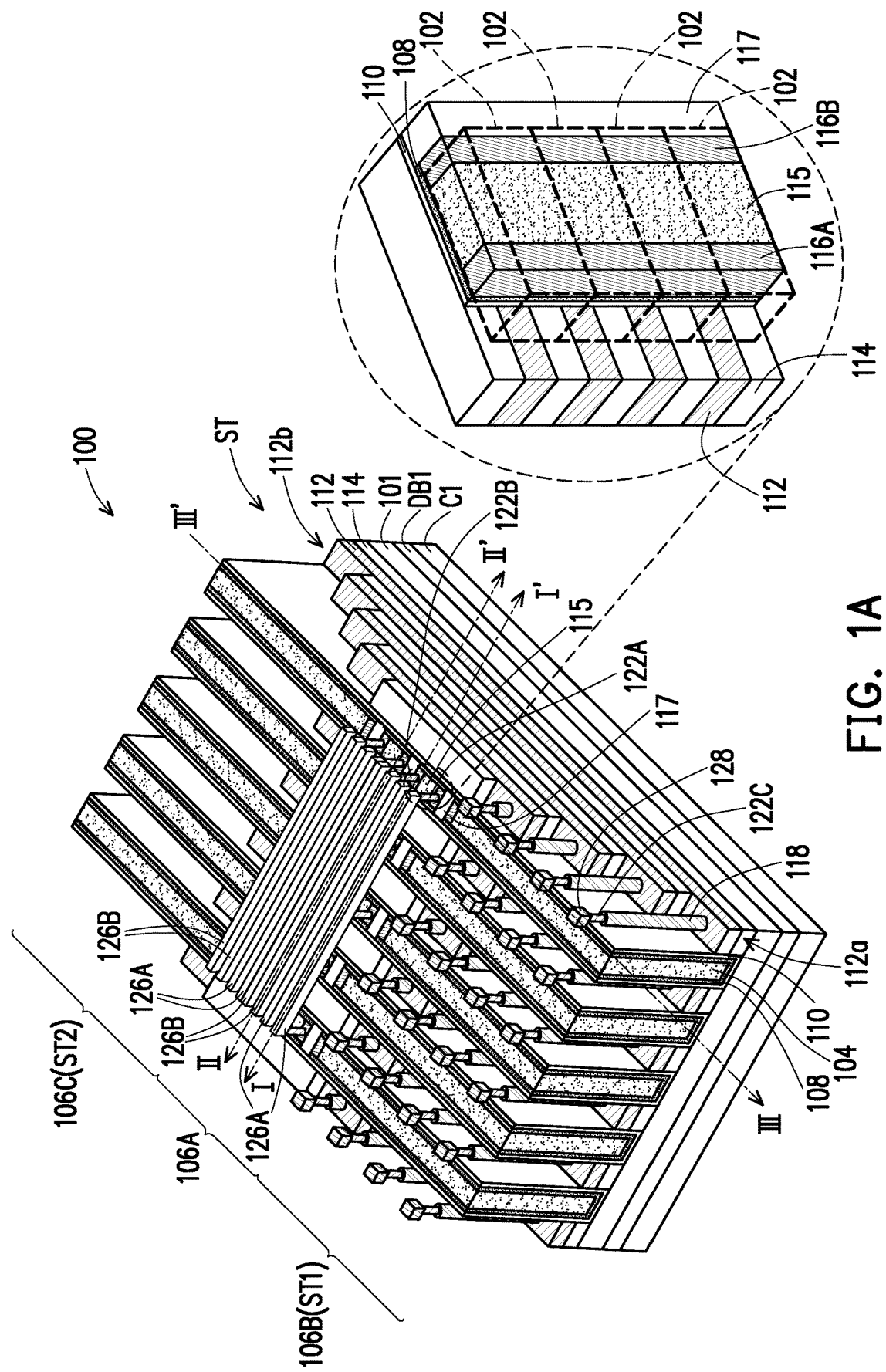
FIG. 1A through FIG. 4C illustrate varying views of manufacturing a memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 180 degrees or at other orientations) and the spatially relative descriptors used herein may likewise be interpreted accordingly.

Various embodiments provide a memory device such as a 3D memory device. In some embodiments, the 3D memory device is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, a source line region acting as a second source/drain electrode, a ferroelectric material acting as a gate dielectric, and an oxide semiconductor (OS) acting as a channel region. In some embodiments, each memory cell is regarded as a thin film transistor (TFT).

FIG. 1A through FIG. 4C illustrate varying views of manufacturing a memory device in accordance with some embodiments. FIG. 1B is illustrated along a reference cross-section I-I' illustrated in FIG. 1A, FIG. 1C is illustrated along a reference cross-section II-II' illustrated in FIG. 1A, and FIG. 1D is illustrated along a reference cross-section III-III' illustrated in FIG. 1A. FIG. 2B through 4B is illustrated along a reference cross-section I-I' illustrated in FIG. 2A through 4A, and FIG. 2C through 4C is illustrated along a reference cross-section I-I' illustrated in FIG. 2A through 4A.

Referring to FIG. 1A through FIG. 1D, a memory 100 is formed over a carrier C1. In some embodiments, a de-bonding layer DB1 is formed on a top surface of the carrier C1, and the memory 100 is formed on the de-bonding layer DB1. For example, the carrier C1 is a glass substrate and the de-bonding layer DB1 is a light-to-heat conversion (LTHC) release layer formed on the glass substrate. However, the disclosure is not limited thereto, and other suitable materials may be adapted for the carrier C1 and the de-bonding layer DB1. In alternative embodiments, a buffer layer (not shown) is coated on the de-bonding layer DB1, where the de-bonding layer DB1 is sandwiched between the buffer layer and the carrier C1, and a top surface of the buffer layer further provides a high degree of coplanarity. The buffer layer may be a dielectric material layer or a polymer layer which is made of polyimide, BCB, PBO, or any other suitable polymer-based dielectric material.

In some embodiments, the memory 100 (also referred to as a memory array) includes a plurality of memory cells 102, which may be arranged in a grid of rows and columns. The memory cells 102 may be further stacked vertically to provide a three dimensional memory, thereby increasing device density.

In some embodiments, the memory 100 is a 3D stackable memory. The memory 100 may be a flash memory, such as a NAND flash memory, a NOR flash memory, or the like. A process temperature of the memory 100 is higher than 400° C., for example. In an embodiment, a process temperature of the memory 100 is about 550° C. In some embodiments, a gate of each memory cell 102 is electrically coupled to a respective word line (e.g., conductive line 112), a first source/drain structure of each memory cell 102 is electrically coupled to a respective conductive line 126A (e.g., bit line), and a second source/drain structure of each memory cell 102 is electrically coupled to a respective conductive line 126B (e.g., source line). The memory cells 102 in a same horizontal row of the memory 100 may share a common word line while the memory cells 102 in a same vertical column of the memory 100 may share a common source line and a common bit line.

In some embodiments, the memory 100 includes a memory cell region 106A and staircase regions 106B, 106C at opposite sides of the memory cell region 106A. The memory cells 102 are disposed over an etching stop layer 101 in the memory cell region 106A. The memory 100 may include a plurality of staircase structures ST in the memory cell region 106A and the staircase regions 106B, 106C, and a dielectric material 104 is disposed between the staircase structures ST. In some embodiments, the staircase structure ST includes a plurality of vertically stacked conductive lines 112 (e.g., word lines) with dielectric layers 114 disposed between adjacent ones of the conductive lines 112. The conductive lines 112 and the dielectric layers 114 are stacked along a direction D from a first side to a second side. The first side is a bottom side and the second side is an upper side, and vice versa. The conductive lines 112 extend in a direction parallel to a major surface of the carrier C1. The conductive lines 112 may have a staircase configuration such that lower conductive lines 112 are longer than and extend laterally past endpoints of upper conductive lines 112. For example, in FIG. 1B, multiple, stacked layers of conductive lines 112 are illustrated with topmost conductive lines 112 being the shortest and bottommost conductive lines 112 being the longest. Respective lengths of the conductive lines 112 may increase in a direction towards the underlying etching stop layer 101. In this manner, a portion of each of the conductive lines 112 may be accessible from above the memory 100, and conductive contacts may be made to exposed portions of the conductive lines 112, respectively. Although the staircase structure ST is illustrated as contacting the etching stop layer 101, any number of intermediate layers may be disposed between the etching stop layer 101 and the staircase structure ST. In alternative embodiments, the etching stop layer 101 is omitted.

The conductive line 112 may each include two barrier layers (not shown) and a metal layer between the barrier layers. Specifically, a barrier layer is disposed between the metal layer and the adjacent dielectric layer 114. The barrier layers may prevent the metal layer from diffusion to the adjacent dielectric layers 114. The barrier layers may also provide the function of increasing the adhesion between the metal layer and the adjacent dielectric layers 114, and may be referred to as glue layers in some examples. In some embodiments, both barrier layers and glue layers with different materials are provided as needed. The barrier layers are formed of a first conductive material, such as a metal nitride, such as titanium nitride, tantalum nitride, molybdenum nitride, zirconium nitride, hafnium nitride, or the like. The metal layer may be formed of a second conductive material, such as a metal, such as tungsten, ruthenium, molybdenum, cobalt, aluminum, nickel, copper, silver, gold, alloys thereof, or the like. The barrier layers and metal layer may each be formed by an acceptable deposition process such as CVD, PVD, ALD, PECVD, or the like.

The memory 100 further includes conductive pillars 116A (e.g., electrically connected to bit lines) and conductive pillars 116B (e.g., electrically connected to source lines) arranged alternately. The conductive pillars 116A and 116B may each extend in a direction perpendicular to the conductive lines 112. A dielectric material 115 is disposed between and isolates adjacent ones of the conductive pillars 116A and the conductive pillars 116B, and a dielectric material 117 is disposed between and isolates adjacent pairs of the conductive pillars 116A and 116B. A material of the conductive pillars 116A, 116B may include copper, titanium, titanium nitride, tantalum, tantalum nitride, tungsten, ruthenium, aluminum, combinations thereof, or the like, which may be formed by a deposition process (e.g., CVD, ALD, PVD, PECVD, or the like) and a planarization (e.g., a CMP, etch back, or the like). In some embodiments, the conductive pillars 116A correspond to and are electrically connected to the bit lines in the memory device, and the conductive pillars 116B correspond to correspond to and are electrically connected to the source lines in the memory 100. In alternative embodiments, the conductive pillars 116A correspond to and are electrically connected to the source lines in the memory device, and the conductive pillars 116B correspond to correspond to and are electrically connected to the bit lines in the memory 100.

Figure 1B:
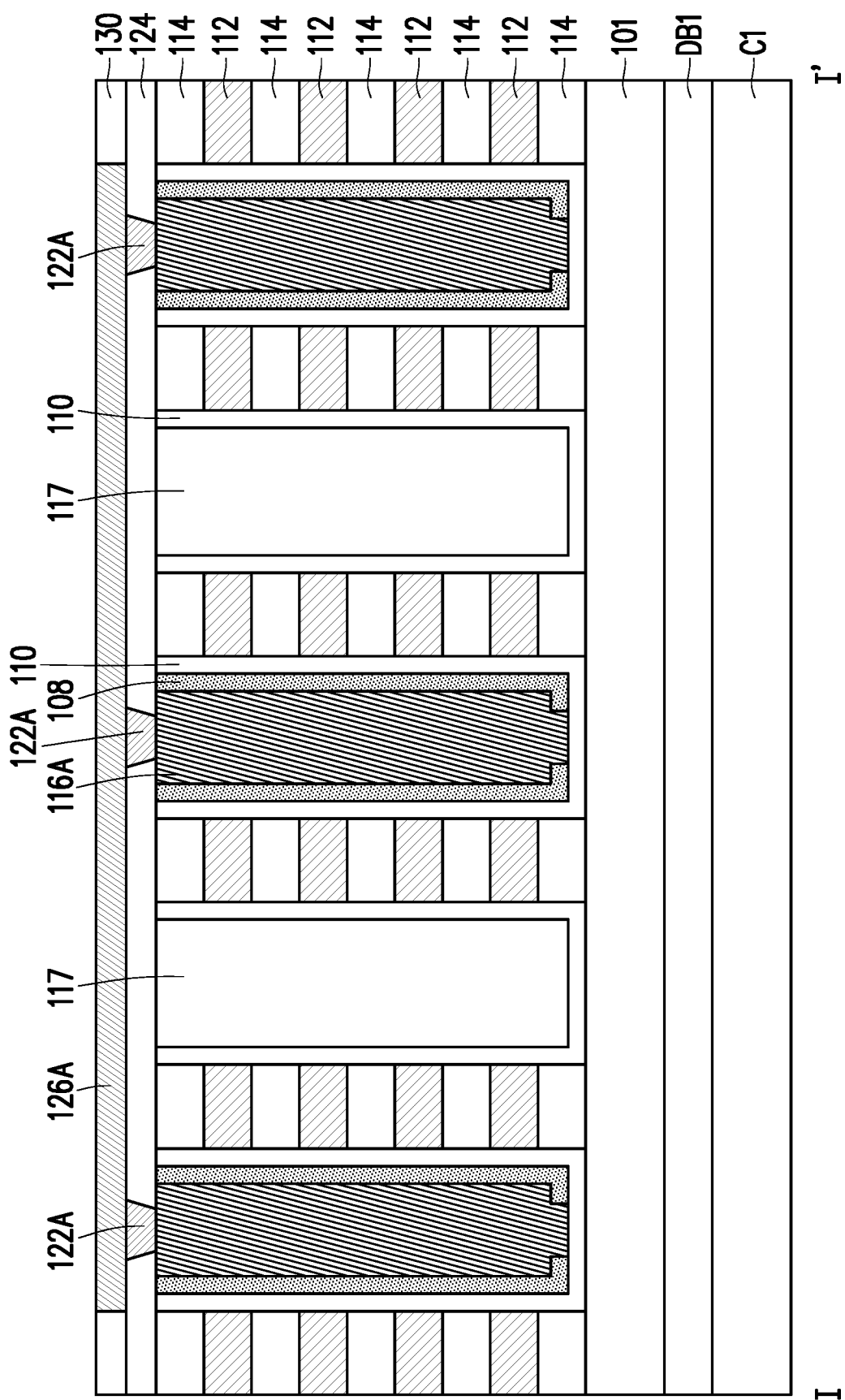
Figure 1C:
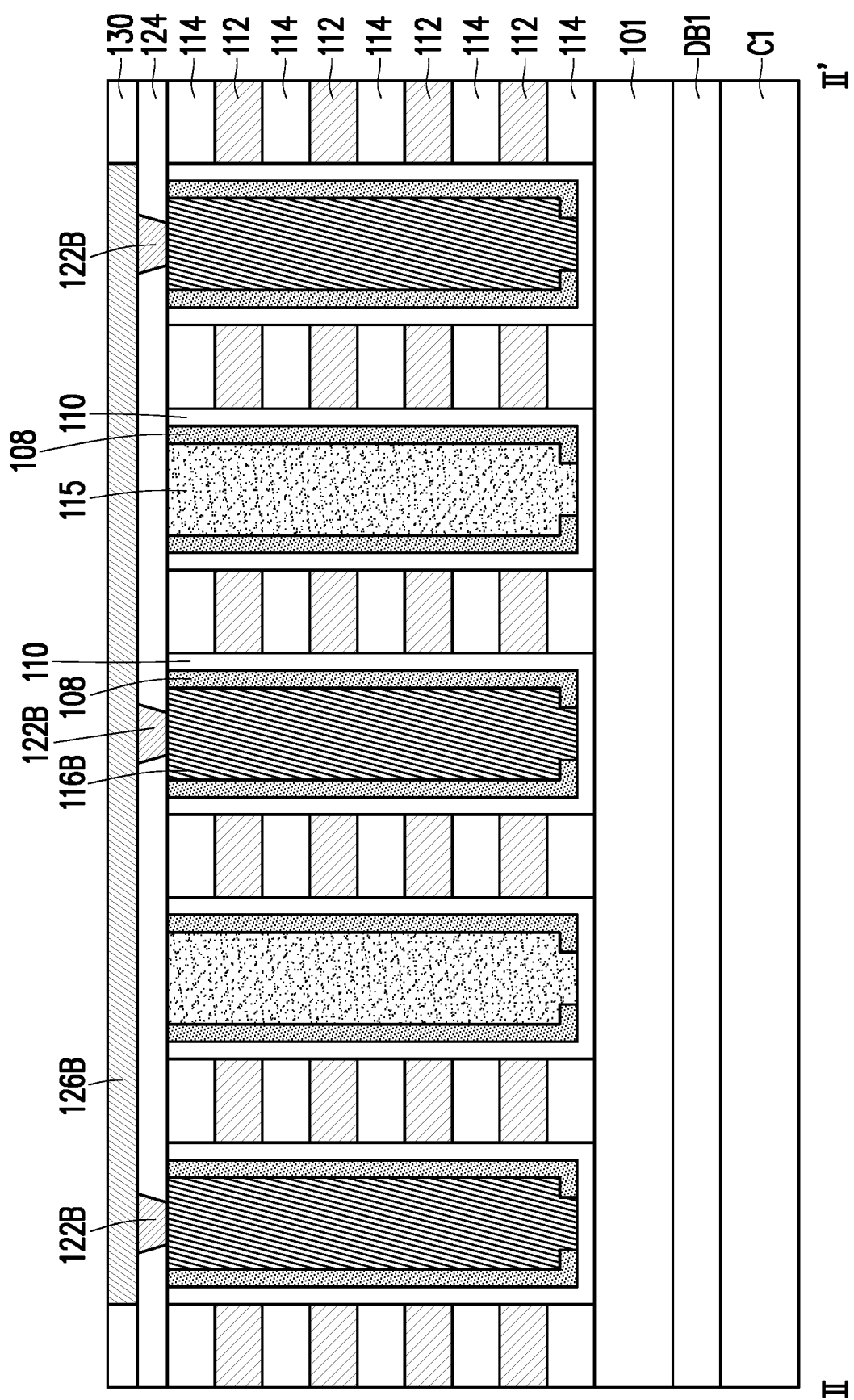
Figure 1D:
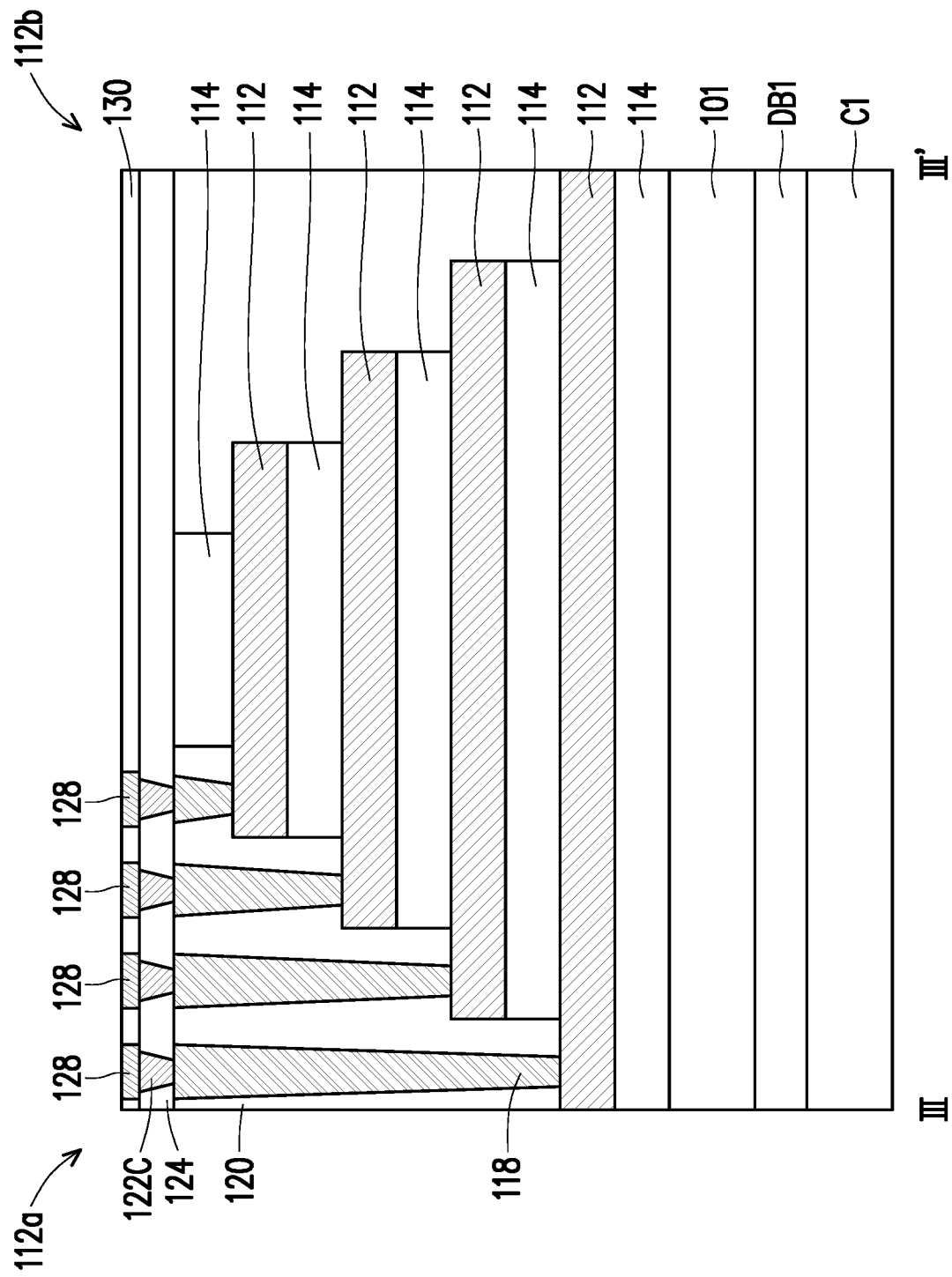

The staircase configuration of the conductive lines 112 are disposed in the staircase regions 106B, 106C, and the conductive pillars 116A and 116B are disposed in the memory cell region 106A. Pairs of the conductive pillars 116A and 116B along with an intersecting conductive line 112 define boundaries of each memory cell 102, and the dielectric material 117 is disposed between and isolates adjacent pairs of the conductive pillars 116A and 116B. In some embodiments, the conductive pillars 116B are electrically coupled to ground. Although FIG. 1B illustrates a particular placement of the conductive pillars 116A relative the conductive pillars 116B, it should be appreciated that the placement of the conductive pillars 116A and 116B may be exchanged in other embodiments. In some embodiments, the memory device is formed by a "staircase first process" in which the staircase structure is formed before the memory cells are formed. However, the disclosure is not limited thereto. In alternative embodiments, the memory device may be formed by a "staircase last process" in which the staircase structure is formed after the memory cells are formed.

In some embodiments, a plurality of conductive contacts 118 are formed to electrically connected to the conductive lines 112 respectively. The conductive contacts 118 may be formed in a dielectric material 120 over the dielectric material 104. Top surfaces of the conductive contacts 118 may be substantially coplanar with top surfaces of the conductive pillars 116A and 116B, the dielectric layers 114 and the dielectric materials 104, 115 and 117. Then, a plurality of conductive contacts 122A, 122B and 122C are formed on and electrically connected to the conductive pillars 116A, the conductive pillars 116B, and the conductive contacts 118, respectively. The conductive contacts 122A, 122B and 122C may be formed in a dielectric material 124 over the dielectric material 120. The conductive material of the conductive contacts 122A, 122B and 122C may include copper, a copper alloy, silver, gold, tungsten, cobalt, aluminum, nickel, or the like.

Then, a plurality of conductive lines 126A, 126B are formed to electrically connect to the conductive contacts 122A and 122B, so as to electrically connect to the conductive pillars 116A and 116B. In some embodiments, the conductive lines 126A, 126B are crossing over the plurality of the conductive lines 112 and the dielectric layers 114. Conductive contacts 128 are formed to electrically connect to the conductive contacts 122C, so as to electrically connect to the conductive lines 112. The conductive lines 126A and the conductive lines 126B may each extend in a direction perpendicular to the conductive lines 112. The conductive lines 126A are electrically connected to the conductive pillars 116A through the conductive contacts 122A, and the conductive lines 126B are electrically connected to the conductive pillars 116B through the conductive contacts 122B. Although the conductive lines 126A and the conductive lines 126B are arranged as shown in FIG. 1A, the conductive lines 126A and the conductive lines 126B may have any suitable arrangement. The conductive contacts 128 are electrically connected to the conductive lines 112 through the conductive contacts 118 and 122C. The conductive lines 126A, 126B and the conductive contacts 128 may be formed simultaneously. The conductive lines 126A, 126B and the conductive contacts 128 are formed in a dielectric material 130 over the dielectric material 124, for example. In alternative embodiments, the conductive line 126A and the corresponding conductive contact 122A are integrally formed, the conductive line 126B and the corresponding conductive contact 122B are integrally formed and/or the conductive contacts 128 and the conductive contacts 122C are integrally formed. For example, the conductive lines 126A, 126B and the conductive contacts 122A and 122B are formed by using a dual damascene process, and the conductive contacts 128 and the conductive contacts 122C are formed by in a same process. In such embodiments, the conductive contact 128 is also referred to as a pad portion, and the conductive contact 122C is also referred to as a via portion. In some embodiments, a width of the conductive contacts 128 is may be larger than a width of the conductive contacts 122C. The conductive contact 128 may be also referred to as a bonding pad, the dielectric material 130 aside the conductive contact 128 may be also referred to as a bonding layer, and the conductive contact 128 and the dielectric material 130 may be also collectively referred to as a bonding structure. The conductive contact 122C may be also referred to as a bonding via. A material of the conductive lines 126A, 126B and the conductive contacts 128 includes copper, silver, gold, tungsten, aluminum, combinations thereof, or the like, for example. The dielectric materials 104, 115, 117, 120, 124 and 130 may include an oxide (e.g., silicon oxide or the like), a nitride (e.g., silicon nitride or the like), phospho-silicate glass (PSG), boro-silicate glass (BSG), boron-doped phospho-silicate glass (BPSG), undoped silicate glass (USG), a combination thereof or the like.

In some embodiments, the memory 100 includes a channel layer 108. The channel layer 108 may provide channel regions for the memory cells 102. For example, when an appropriate voltage (e.g., higher than a respective threshold voltage ($V_{th}$) of a corresponding memory cell 102) is applied through a corresponding conductive line 112, a region of the channel layer 108 that intersects the conductive line 112 allows current to flow between the conductive pillars 116A and the conductive pillars 116B. The channel layer 108 includes materials suitable for providing channel regions for the memory cells 102. For example, the channel layer 108 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, the channel layer 108 includes polycrystalline silicon (poly-Si), amorphous silicon (a-Si), or the like. The channel layer 108 may be deposited by CVD, PVD, ALD, PECVD, or the like.

In some embodiments, a memory material layer 110 is disposed between the channel layer 108 and each of the conductive lines 112 and the dielectric layer 114, and the memory material layer 110 serve as a gate dielectric for each memory cell 102. In some embodiments, the memory material layer 110 includes a ferroelectric material, such as a hafnium oxide, hafnium zirconium oxide, silicon-doped hafnium oxide, or the like.

The memory material layer 110 may be polarized in one of two different directions, and the polarization direction may be changed by applying an appropriate voltage differential across the memory material layer 110 and generating an appropriate electric field. The polarization may be relatively localized (e.g., generally contained within each boundaries of the memory cells 102), and a continuous region of the memory material layer 110 may extend across a plurality of memory cells 102. Depending on a polarization direction of a particular region of the memory material layer 110, a threshold voltage of a corresponding memory cell 102 varies, and a digital value (e.g., 0 or 1) can be stored. For example, when a region of the memory material layer 110 has a first electrical polarization direction, the corresponding memory cell 102 may have a relatively low threshold voltage, and when the region of the memory material layer 110 has a second electrical polarization direction, the corresponding memory cell 102 may have a relatively high threshold voltage. The difference between the two threshold voltages may be referred to as the threshold voltage shift. A larger threshold voltage shift makes it easier (e.g., less error prone) to read the digital value stored in the corresponding memory cell 102.

To perform a write operation on a memory cell 102 in such embodiments, a write voltage is applied across a portion of the memory material layer 110 corresponding to the memory cell 102. In some embodiments, the write voltage is applied, for example, by applying appropriate voltages to a corresponding conductive line 112 (e.g., the word line) and the corresponding conductive pillars 116A/116B (e.g., the bit line/source line). By applying the write voltage across the portion of the memory material layer 110, a polarization direction of the region of the memory material layer 110 may be changed. As a result, the corresponding threshold voltage of the corresponding memory cell 102 may also be switched from a low threshold voltage to a high threshold voltage or vice versa, and a digital value may be stored in the memory cell 102. Because the conductive lines 112 intersect the conductive pillars 116A and 116B, individual memory cells 102 may be selected for the write operation.

To perform a read operation on the memory cell 102 in such embodiments, a read voltage (a voltage between the low and high threshold voltages) is applied to the corresponding conductive line 112 (e.g., the word line). Depending on the polarization direction of the corresponding region of the memory material layer 110, the memory cell 102 may or may not be turned on. As a result, the conductive pillar 116A may or may not be discharged through the conductive pillar 116B (e.g., a source line that is coupled to ground), and the digital value stored in the memory cell 102 can be determined. Because the conductive lines 112 intersect the conductive pillars 116A and 116B, individual memory cells 102 may be selected for the read operation.

In some embodiments, the staircase shape of the conductive lines 112 provides a surface on each of the conductive lines 112 for the conductive contact 122C to land on. The conductive line 112 has opposite sides 112a and 112b, and the conductive contact 122C for the conductive line 112 are disposed on one of the sides 112a and 112b. In an embodiment in which the memory 100 is a single-sided driving structure, the conductive contact 122C for the conductive line 112 is disposed at one of the sides 112a and 112b. In an embodiment in which the memory 100 is a double-sided driving structure, the conductive contacts 122C for the conductive line 112 are disposed at both sides 112a and 112b. In some embodiments, as shown in FIG. 1A, the conductive contacts 122C for the staircase structure ST are disposed at the same side 112a of the conductive lines 112. In some embodiments, the opposite sides 112a and 112b are also referred to as opposite sides of the memory cell region 106A or opposite sides of the staircase structure ST. In some embodiments, the staircase structure ST includes a staircase ST1 in the staircase region 106B and a staircase ST2 in the staircase region 106C. In an embodiment in which the memory 100 is a single-sided driving structure, one of the staircases ST1 and ST2 is used, and the other of the staircases ST1 and ST2 is non-used. Thus, the used staircase may be also referred to as a used staircase, and the non-used staircase may be also referred to as a non-used staircase. For example, as shown in FIG. 1A, the conductive contacts 122C are all disposed on the to the staircases ST1, the staircases ST1 are used staircases, and the staircases ST2 are non-used staircases.

Figure 2A:
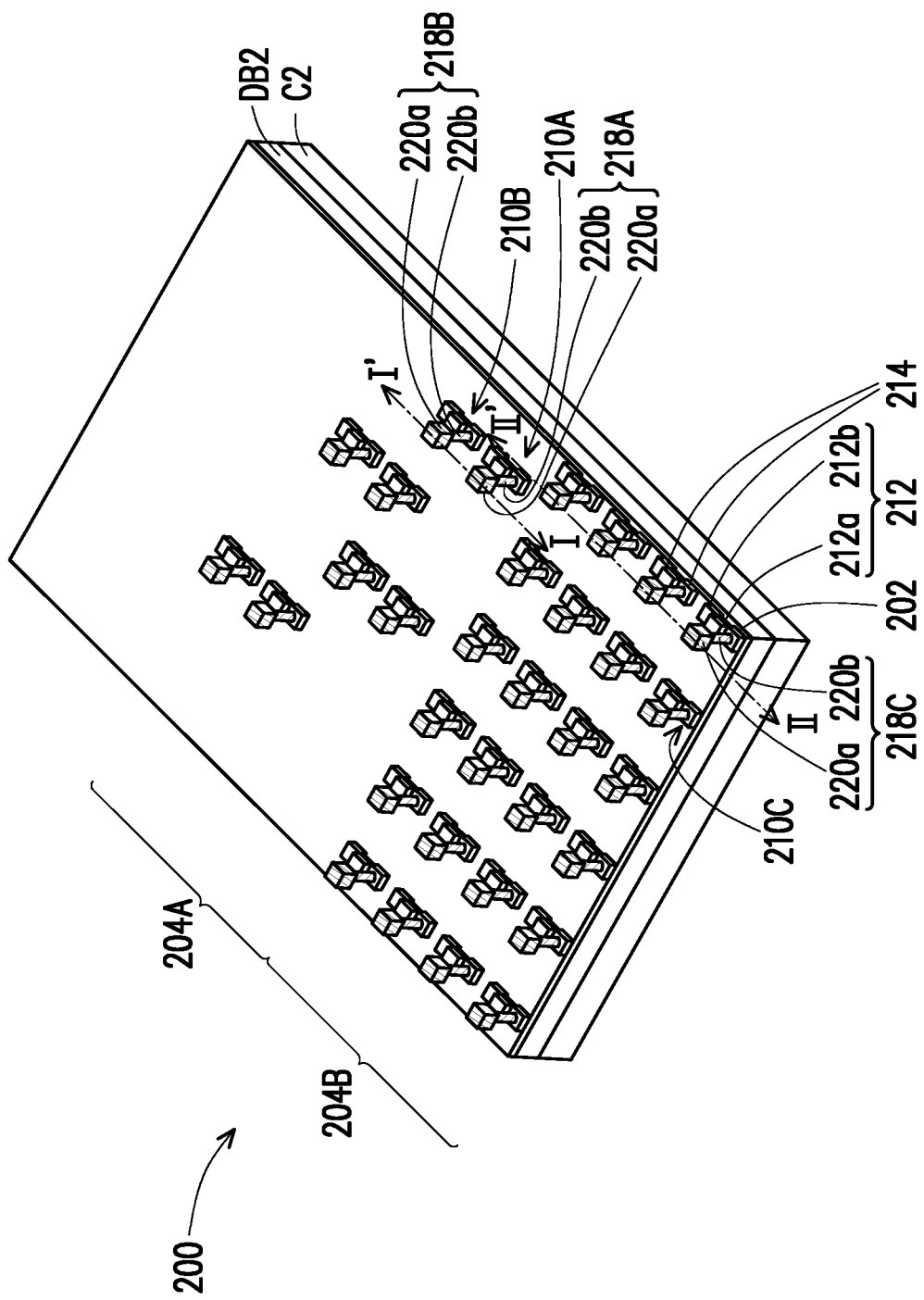
Figure 2B:
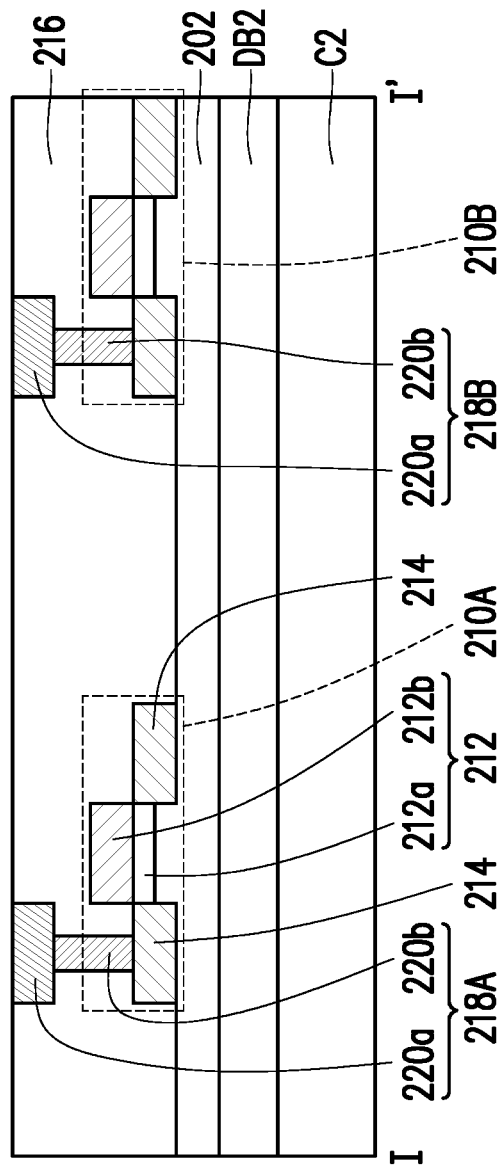
Figure 2C:
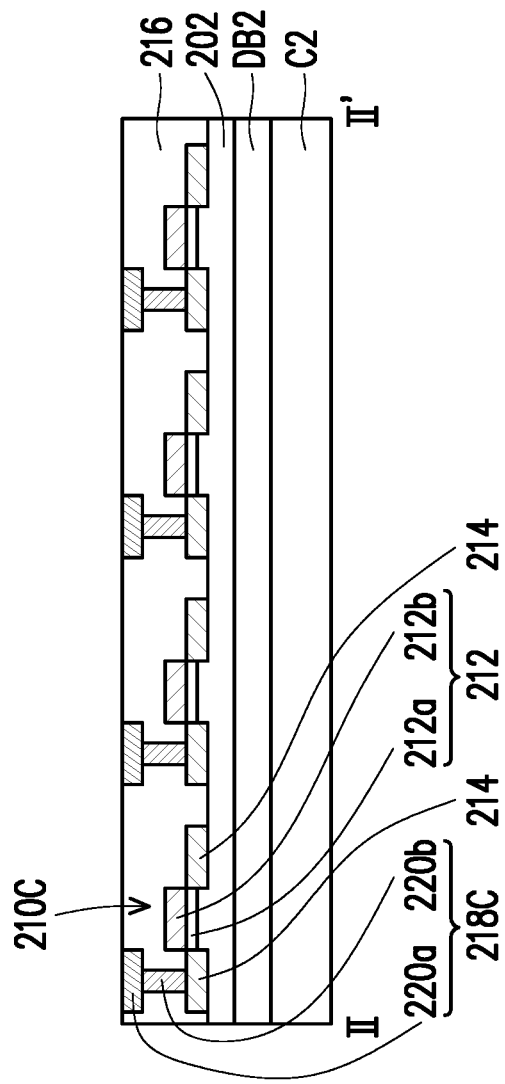

Referring to FIG. 2A, FIG. 2B and FIG. 2C, a circuit structure 200 is formed over a carrier C2. In some embodiments, the circuit structure 200 is also referred to as a periphery circuit. A process temperature of the circuit structure 200 is lower than 400° C., for example. In some embodiments, the circuit structure 200 includes a plurality of drivers 210A, 210B and 210C. The drivers 210A, 210B and 210C may be formed on and in a substrate 202. The substrate 202 may be a semiconductor substrate, such as a wafer, a bulk semiconductor, a semiconductor-on-insulator (SOI) substrate, or the like, which may be doped (e.g., with a p-type or an n-type dopant) or undoped. Generally, the SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The drivers 210A, 210B and 210C may include transistors. For example, the drivers 210A, 210B and 210C respectively include a gate structure 212 and a source/drain structure 214 on opposite sides of the gate structure 212. The gate structure 212 may include a gate dielectric layer 212a over a top surface of the substrate 202, a gate electrode 212b over the gate dielectric layer 212a and a gate spacer 212c formed along a sidewall of the gate dielectric layer 212a and the gate electrode 212b. The source/drain structure 214 is a doping region in the substrate 202 or an epitaxial structure formed in a recess of the substrate 202. The gate spacer 212c may separate the source/drain structure 214 from the gate electrode 212b by appropriate lateral distances. In some embodiments, the transistors of the drivers 210A, 210B and 210C are referred as planar-type transistors, and skin portions of the substrate 202 respectively covered by the gate structure 212 and extending between the source/drain structures 214 is functioned as a conductive channel of the transistor. In some embodiments, an isolation structure 204 such as shallow trench isolation (STI) is formed between the transistors of the drivers 210A, 210B and 210C. A well (not shown) may be formed between the isolation structures 204, and the source/drain structure 214 is formed in the well. In alternative embodiments, the transistors of the drivers 210A, 210B and 210C are respectively formed as a fin-type transistor or a gate-all-around (GAA) transistor. In such embodiments, three-dimensional structure(s) (e.g., fin structure(s), nanosheet(s) or the like) intersected with and covered by a gate structure are functioned as conductive channel(s) of the transistor. Although FIG. 2A, FIG. 2B and FIG. 2C discuss transistors formed on and in the substrate 202, other active devices (e.g., diodes or the like) and/or passive devices (e.g., capacitors, resistors, or the like) may also be formed as part of the circuit structure 200. In some embodiments, in addition to the memory circuit, the circuit structure 200 further includes logic circuits, sense amplifiers, controllers, input/output circuits, image sensor circuits, the like, or combinations thereof.

The drivers 210A, 210B and 210C are disposed corresponding to the conductive lines 126A, 126B and 112, respectively. A number of the drivers 210A, 210B and 210C may be respectively the same as the conductive lines 126A, 126B and 112. The substrate 202 may include a region 204A corresponding to the memory cell region 106A and a region 204B corresponding to one of the staircase region 106B and 106C. In an example in which the memory device is a single-sided driving structure, the second region 204B corresponds to one of the staircase regions 106B and 106C. For example, as shown in FIG. 2A, the second region 204B corresponds to the staircase region 106B. In some embodiments, the drivers 210A and 210B are disposed in the region 204A, and the drivers 210C are disposed in the region 204B. A shown in FIG. 2A, at least two of the drivers 210A and 210B are disposed adjacent to each other. For example, the drivers 210A are disposed immediately adjacent to each other, the drivers 210B are disposed immediately adjacent to each other, and the driver 210A and the driver 210B are disposed immediately adjacent to each other. However, the disclosure is not limited thereto. The drivers 210A and 210B may have any suitable arrangement. The drivers 210C may be arranged in a grid of rows and columns. A number of the rows of the drivers 210C is the same as a number of the staircase structures ST, and a number of the columns of the drivers 210C is the same as a number of the conductive lines 112 of one staircase structure ST. The drivers 210A and 210B may be alternately arranged. In some embodiments, a spacing between adjacent transistors of the drivers 210C and between adjacent transistors of drivers 210A and 210B ranges from 10 nm to 1000 nm. Furthermore, although not shown, the drivers 210A, 210B and 210C may further include other active device(s) and/or passive device(s).

A dielectric material 216 may surrounds and isolates the gate dielectric layers 212a and the gate electrodes 212b. In some embodiments, a plurality of conductive contacts 218A, 218B and 218C are formed on and electrically connected to the drivers 210A, 210B and 210C, respectively. For example, the conductive contacts 218A, 218B and 218C are formed to electrically connected to the source/drain structures 214 of the drivers 210A, 210B and 210C. The conductive contacts 218A, 218B and 218C may be also referred to as source/drain contacts. In some embodiments, the conductive contacts 218A, 218B and 218C are formed in the dielectric material 216. In some embodiments, the conductive contacts 218A, 218B and 218C respectively include a pad portion 220a and a via portion 220b between the pad portion 220a and the driver 210A, 210B or 210C. The pad portion 220a may have a width lager than the via portion 220b. In some embodiments, the pad portion 220a is also referred to as a bonding pad, the via portion 220b is also referred to as a bonding via, the dielectric material 216 is also referred to as a bonding layer, and the pad portion 220a, the via portion 220b and the dielectric material 216 may be also collectively referred to as a bonding structure.

Figure 3A:
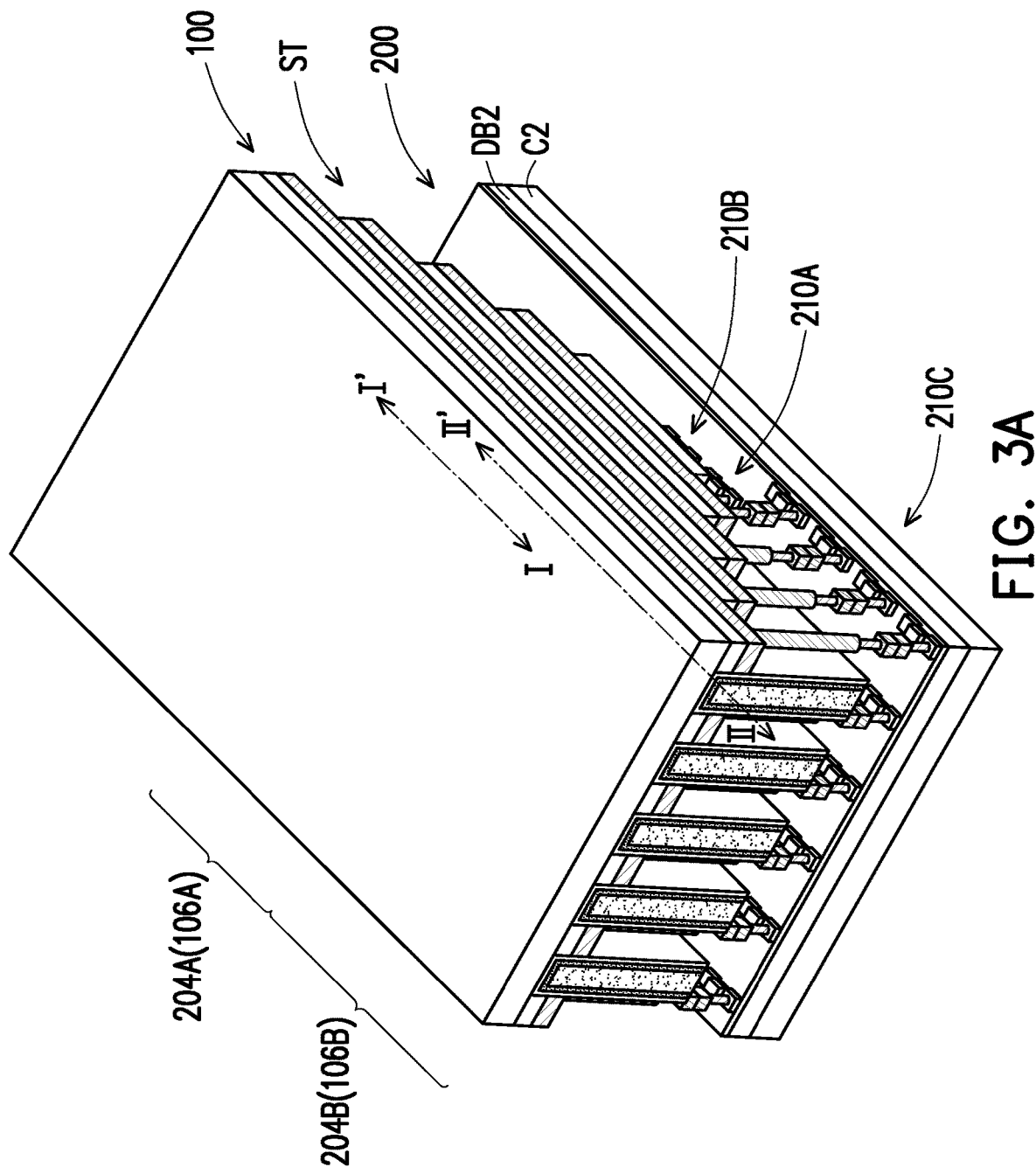
Figure 3B:
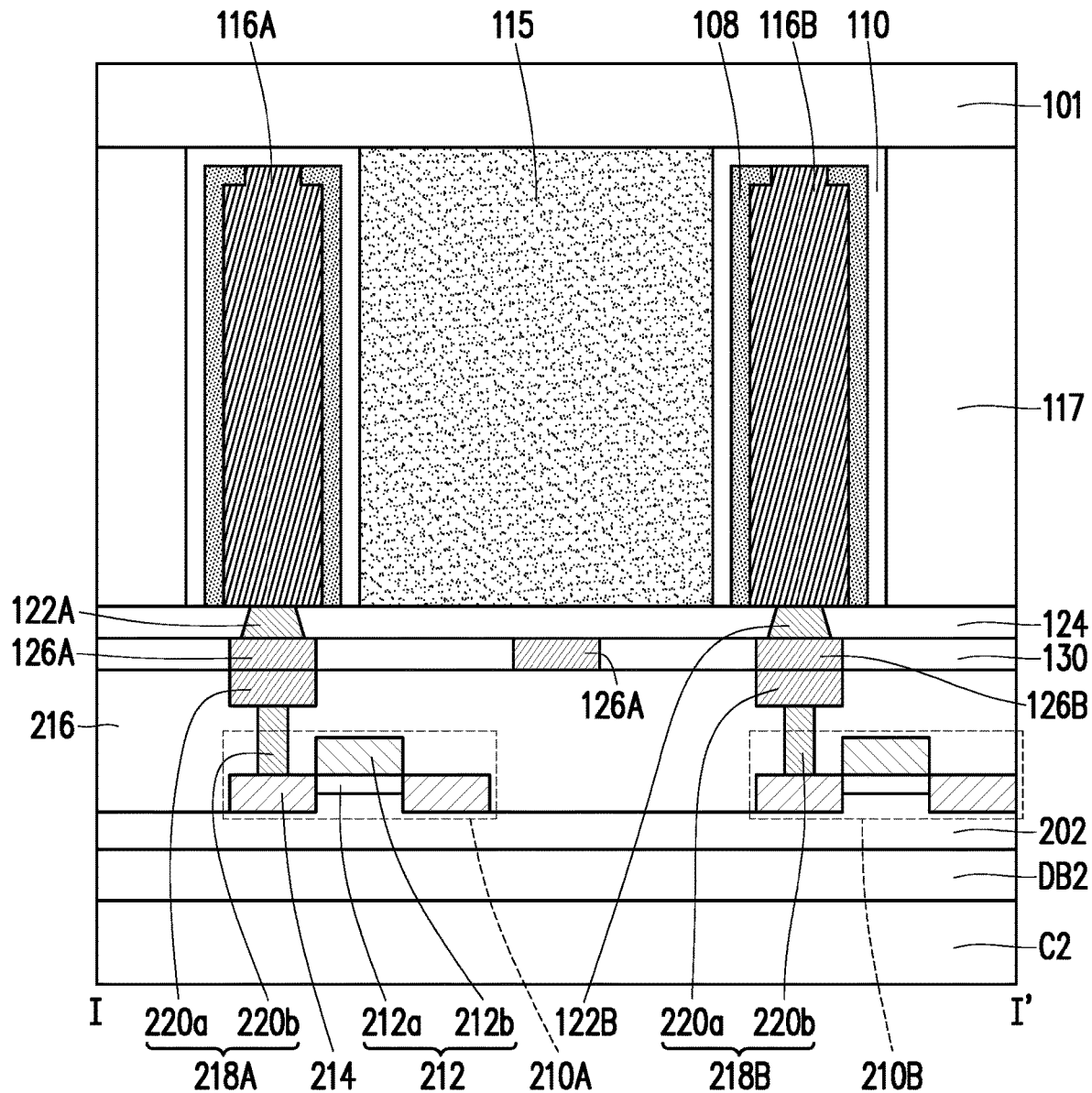
Figure 3C:
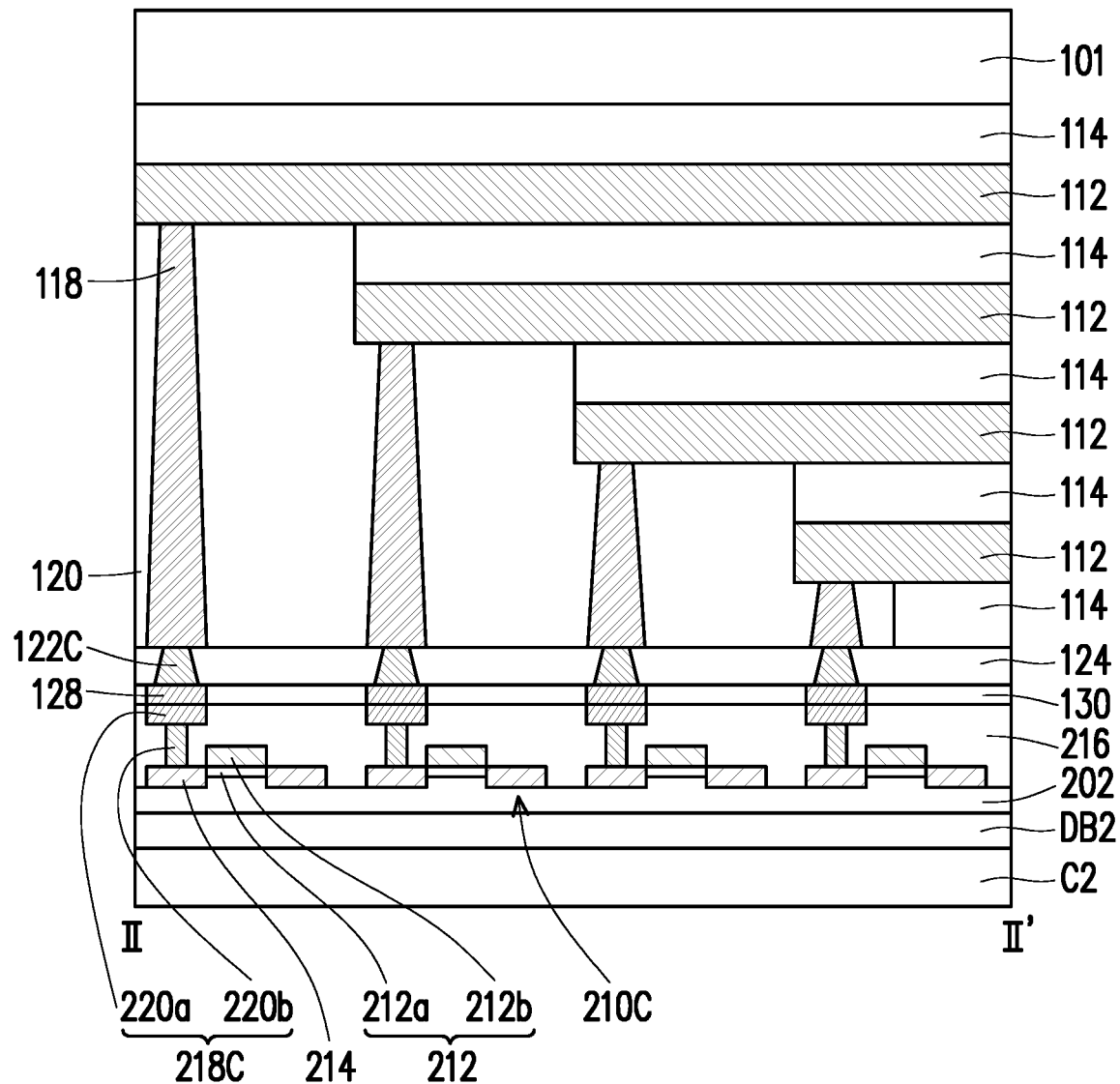

Referring to FIG. 3A, FIG. 3B and FIG. 3C, the memory 100 and the circuit structure 200 are bonded. In some embodiments, the memory 100 is de-bonded and is separated from the carrier C1. In some embodiments, the de-bonding process includes projecting a light such as a laser light or an UV light on the de-bonding layer DB1 (e.g., the LTHC release layer) so that the carrier C1 can be easily removed along with the de-bonding layer DB1. During the de-bonding step, a tape (not shown) may be used to secure the structure before de-bonding the carrier C1 and the de-bonding layer DB1. After de-bonding, the memory 100 is bonded onto the circuit structure 200 through a wafer to wafer bonding process, for example. In some embodiments, the conductive lines 126A are bonded to the conductive contacts 218A of the drivers 210A, the conductive lines 126B are bonded to the conductive contacts 218B of the drivers 210B, and the conductive contacts 128 of the conductive lines 112 are bonded to the conductive contacts 218C of the drivers 210C. Accordingly, the conductive lines 126A are electrically connected to the drivers 210A, the conductive lines 126B are electrically connected to the drivers 210B, and the conductive lines 112 are electrically connected to the drivers 210C, respectively. The dielectric material 130 may be bonded to the dielectric material 216. In some embodiments, as shown in FIG. 3A, the conductive lines 126A connecting to the adjacent drivers 210A may be physically separated by at least one conductive line 126A, 126B therebetween. For example, the conductive lines 126A, 126B connecting to the adjacent drivers 210A, 210B are physically separated by two conductive lines 126A, 126B therebetween. However, the disclosure is not limited thereto. The drivers 210A and the drivers 210B may have any suitable arrangement. For example, the conductive lines 126A, 126B connecting to the adjacent drivers 210A, 210B are immediately adjacent to each other or physically separated by one or more conductive lines 126A, 126B therebetween. In some embodiments, a reflow process may be performed. During the bonding process, a process temperature may be lower than 400° C.

Figure 4A:
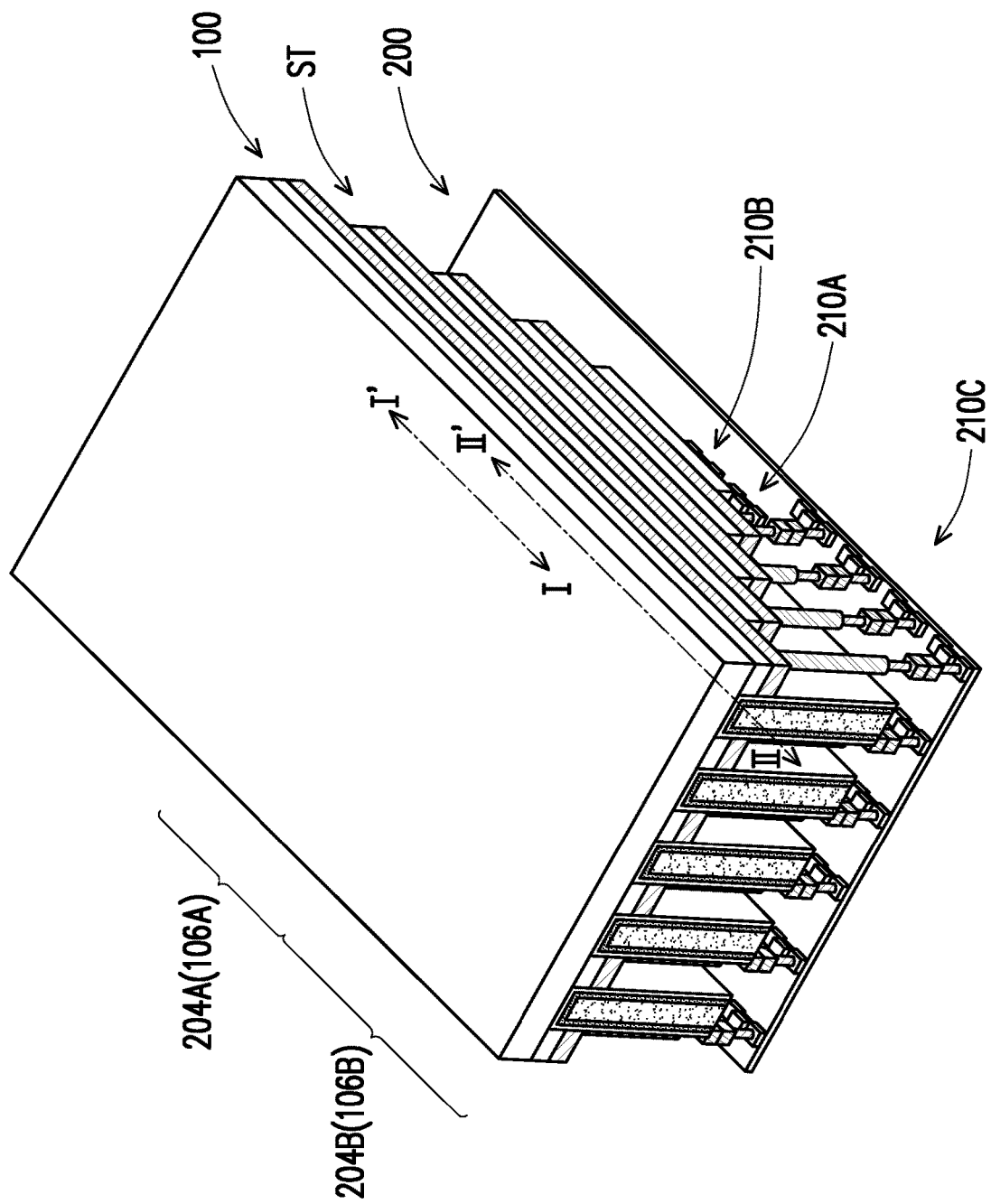
Figure 4B:
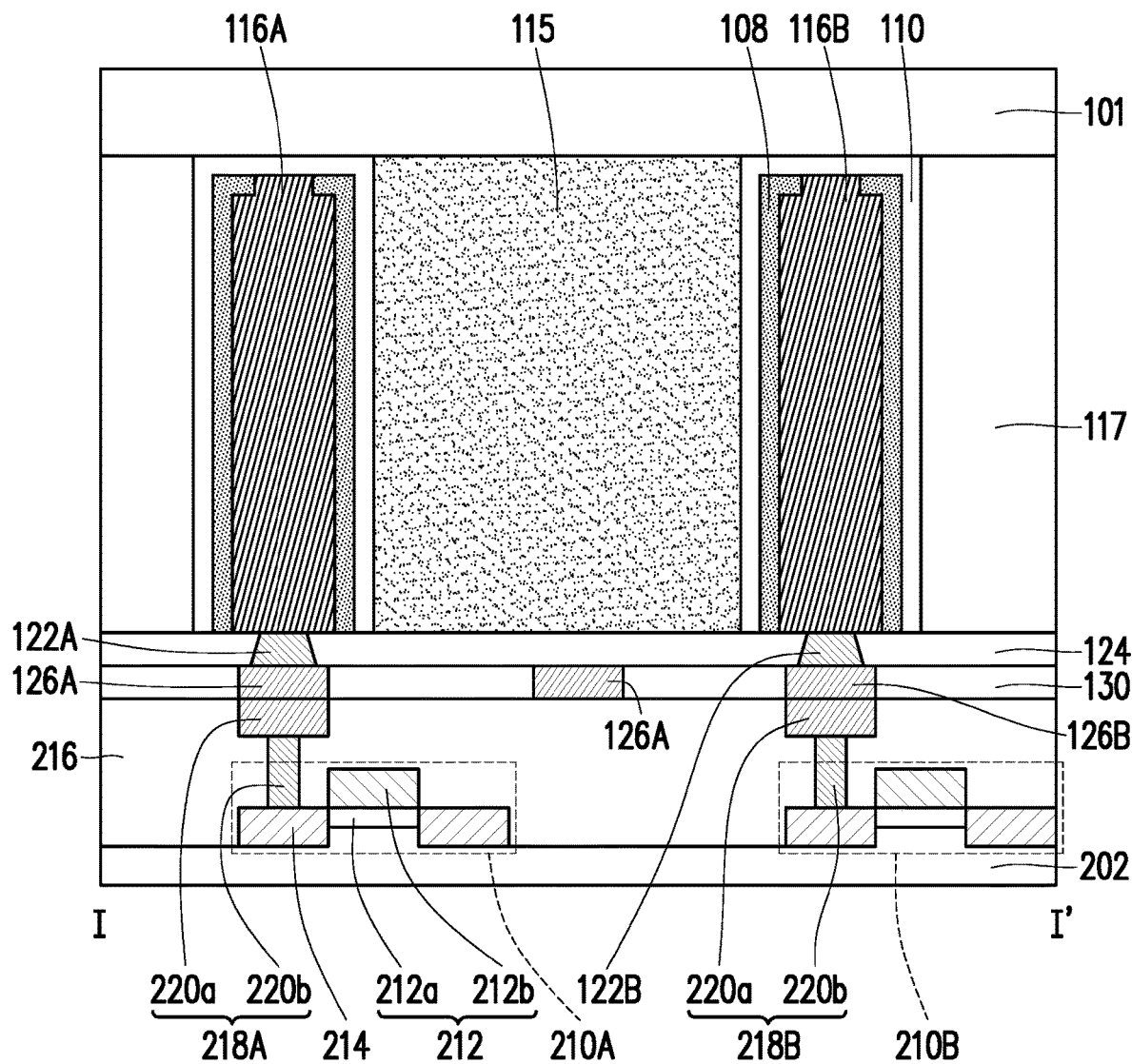
Figure 4C:
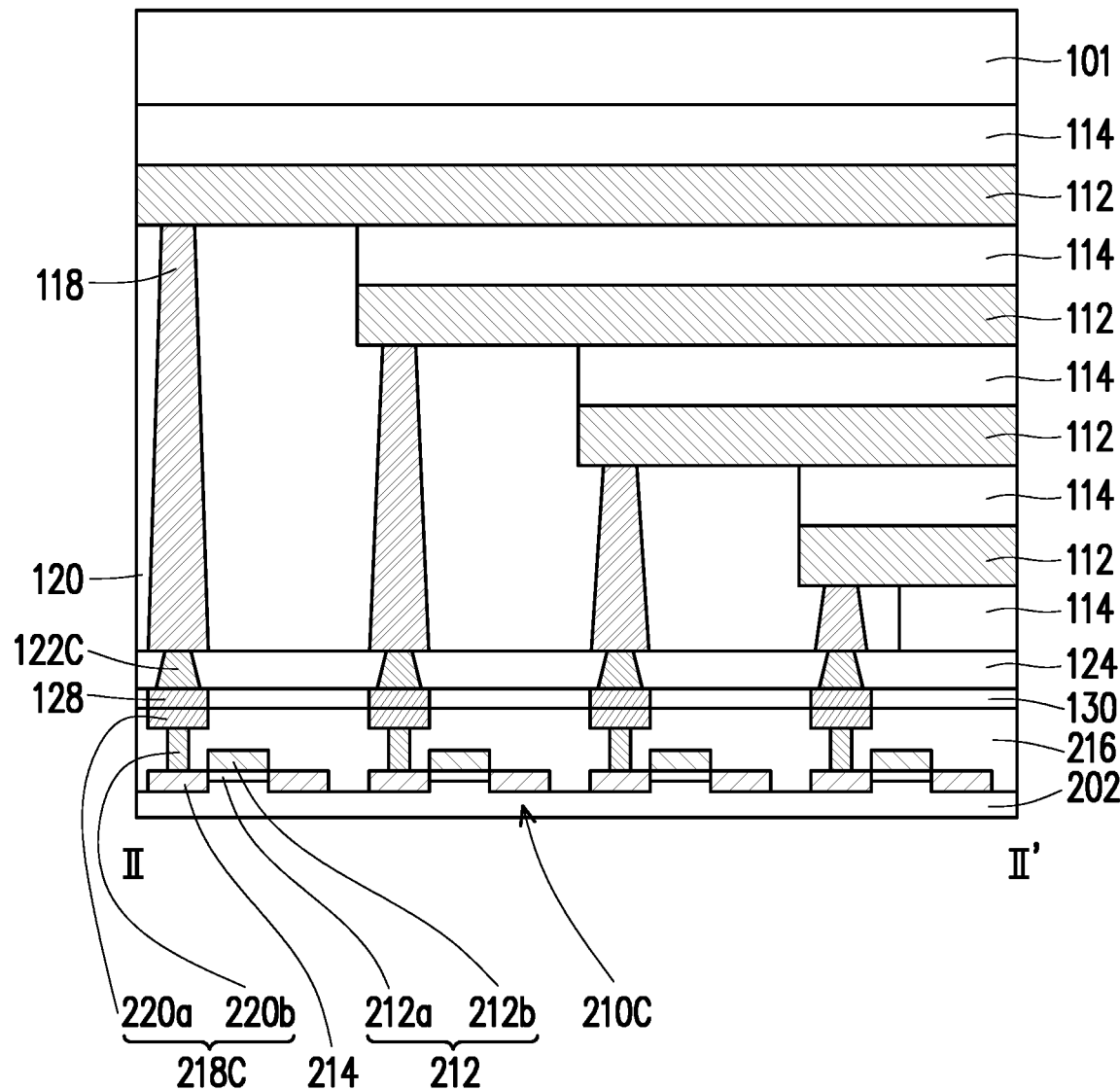

Referring to FIG. 4A, FIG. 4B and FIG. 4C, the formed structure of FIG. 3A, FIG. 3B and FIG. 3C is de-bonded from the carrier C2, to form a memory device 10. In some embodiments, the de-bonding process includes projecting a light such as a laser light or an UV light on the de-bonding layer DB2 (e.g., the LTHC release layer) so that the carrier C2 can be easily removed along with the de-bonding layer DB2. During the de-bonding step, a tape (not shown) may be used to secure the structure before de-bonding the carrier C2 and the de-bonding layer DB2. In some embodiments, a thinning process such as a grinding process is performed on the substrate 202 after de-bonding from the carrier C2, so as to reduce a total thickness of the formed structure.

Figure 5A:
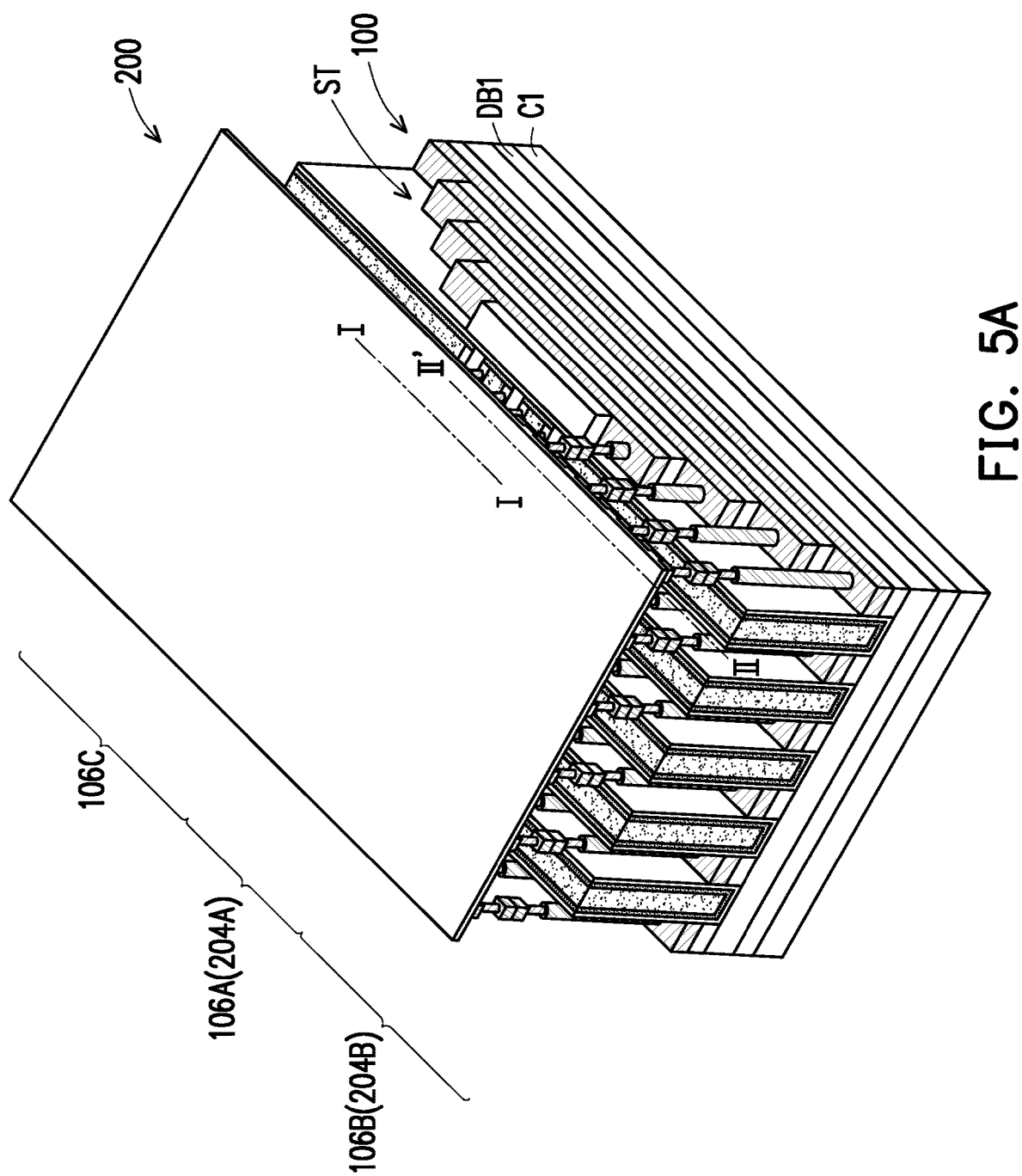
FIG. 5A through FIG. 5C illustrate varying views of a memory device in accordance with some embodiments.
Figure 5B:
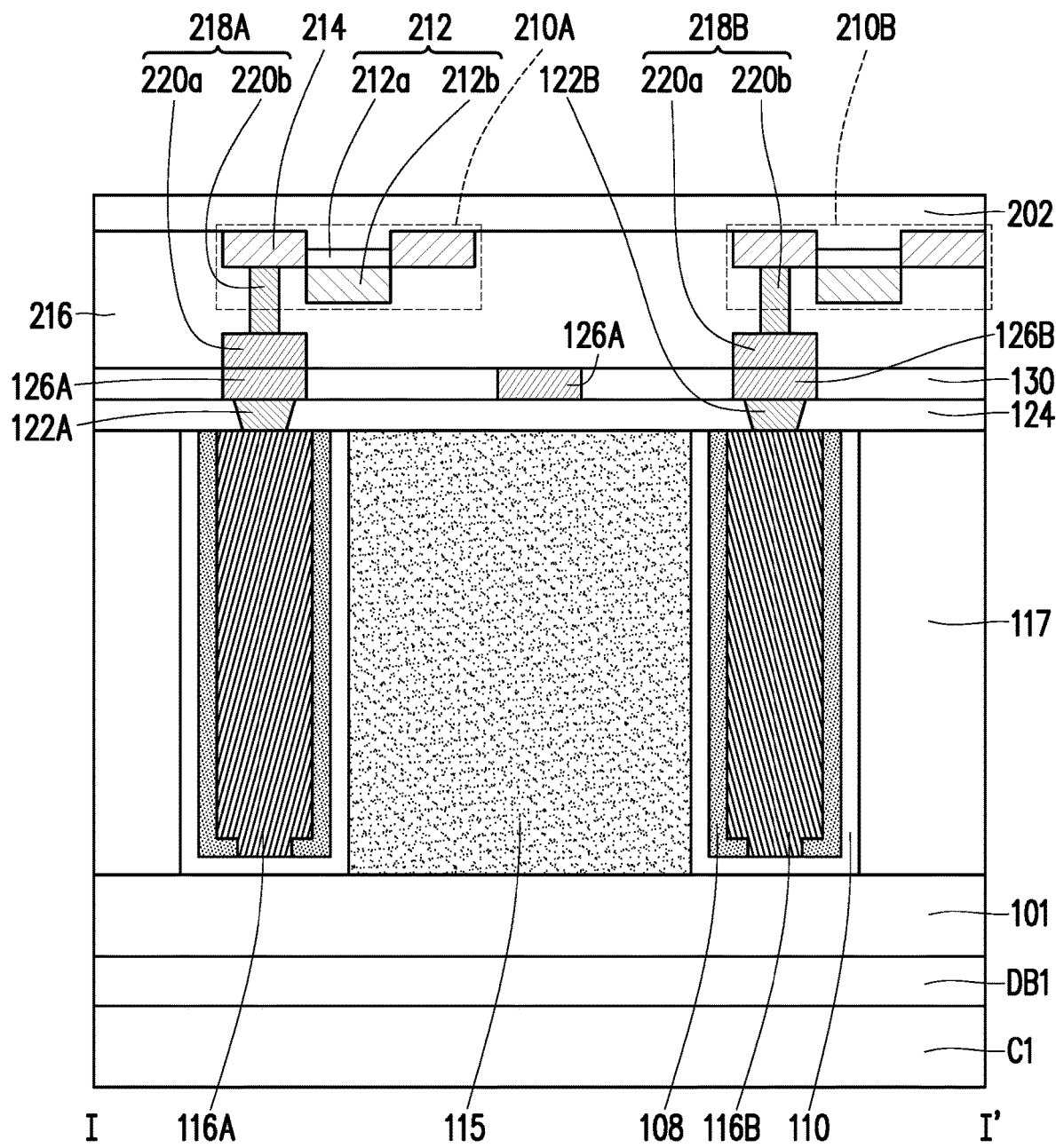
Figure 5C:
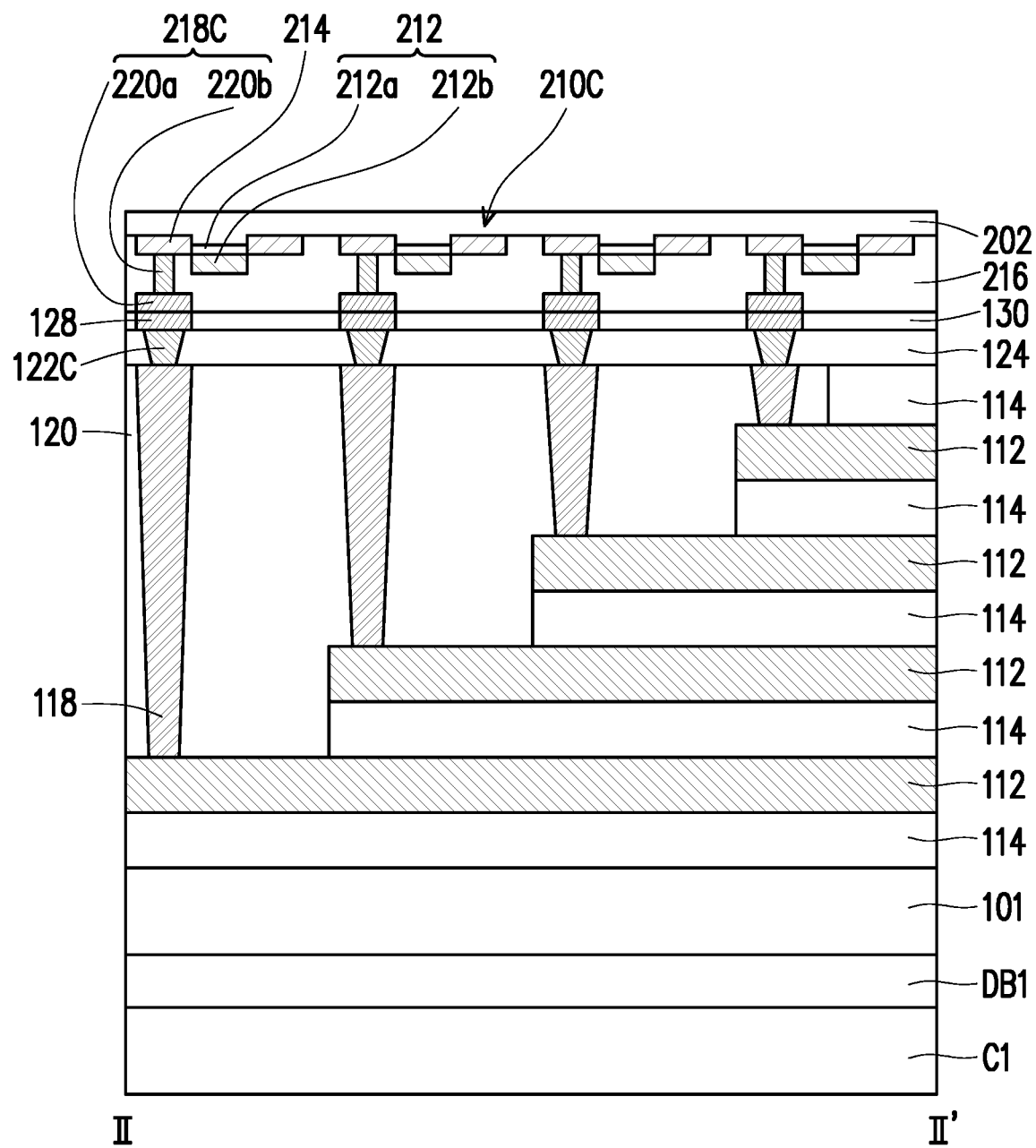

In some embodiments, the memory 100 is bonded onto the circuit structure 200 over the carrier C2, and then the resulting structure is de-bonded from the carrier C2. However, the disclosure is not limited thereto. In alternative embodiments, as shown in FIG. 5A, FIG. 5B and FIG. 5C, the circuit structure 200 is bonded onto the memory 100 over the carrier C1. Then, the resulting structure is de-bonded from the carrier C1, to form the memory device 10 as shown in FIG. 4A, FIG. 4B and FIG. 4C. In some embodiments, a thinning process such as a grinding process is performed on the substrate 202 after bonding the circuit structure 200 to the memory 100, so as to reduce a total thickness of the formed structure.

In some embodiments, the memory 100 and the circuit structure 200 are formed separately and then combined by bonding. In other words, the memory 100 and the circuit structure 200 may be formed under different process condition such as process temperature, and one would not have an impact on the other. For example, the memory 100 without the periphery circuit is fabricated under a relative high temperature such as 550° C. which may have impact on the circuit structure 200, however, the impact is prevented since the memory 100 and the circuit structure 200 are formed separately. Accordingly, the memory and the circuit structure may be formed under the desired condition thereof, and the performance of the formed memory device is improved.

In some embodiments, the circuit structure 200 is formed at one side of the memory 100. For example, the drivers 210A, 210B and 210C are all disposed below or above the memory 100. However, the disclosure is not limited thereto. In alternative embodiments, the drivers 210A, 210B and 210C are formed at different sides of the memory 100.

FIG. 6A through FIG. 10B illustrate varying views of manufacturing a memory device in accordance with some embodiments. FIG. 6B and FIG. 6C are illustrated along reference cross-sections I-I' and II-II' illustrated in FIG. 6A. FIG. 8B through FIG. 10B are illustrated along reference cross-sections III-III' illustrated in FIG. 8A through FIG. 10A. The manufacturing method is similar to the patterning method of FIG. 1A to FIG. 4A and FIG. 1B to FIG. 4B, and the main difference is described as below.

Figure 6A:
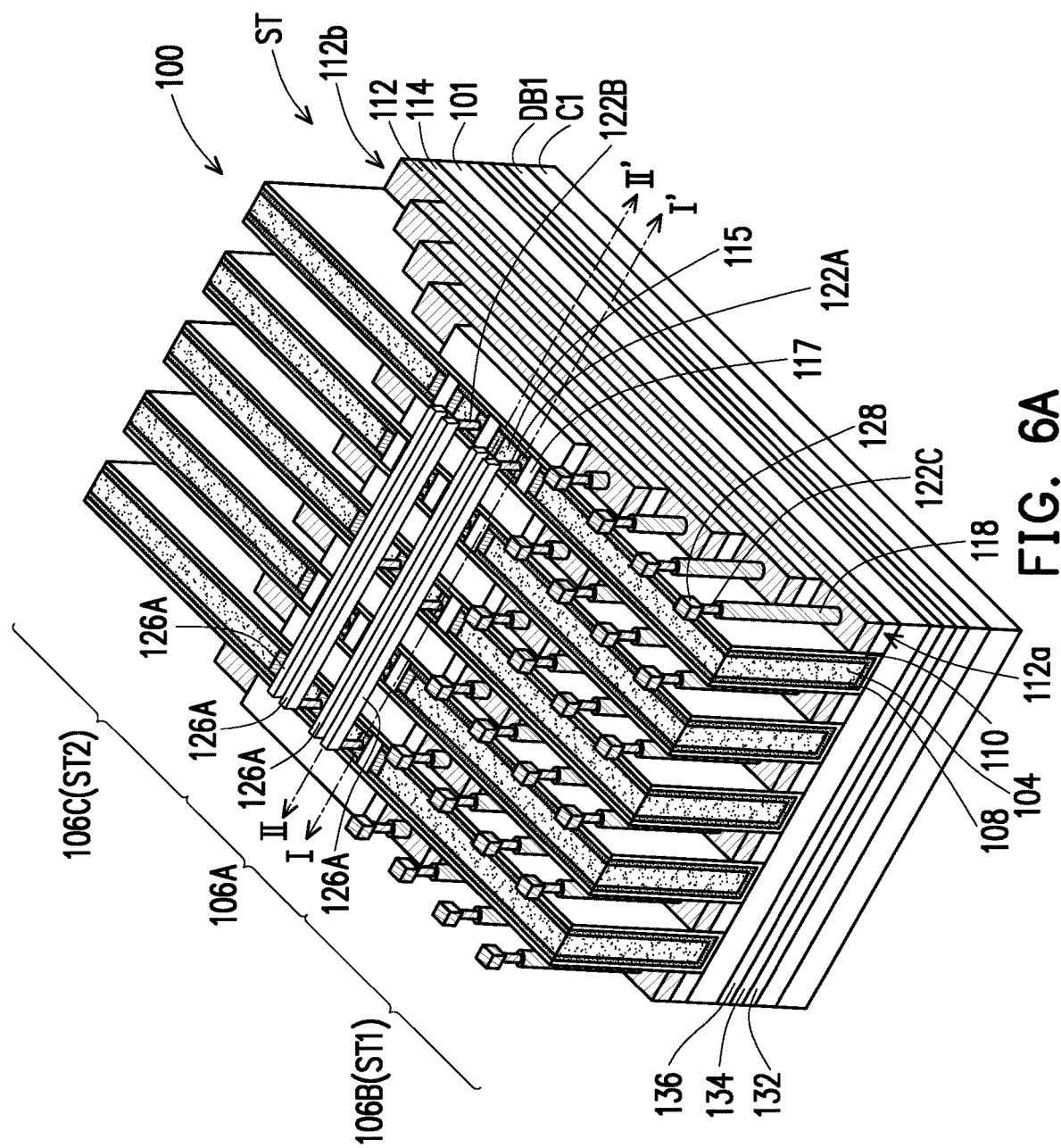
FIG. 6A through FIG. 10B illustrate varying views of manufacturing a memory device in accordance with some embodiments.
Figure 6B:
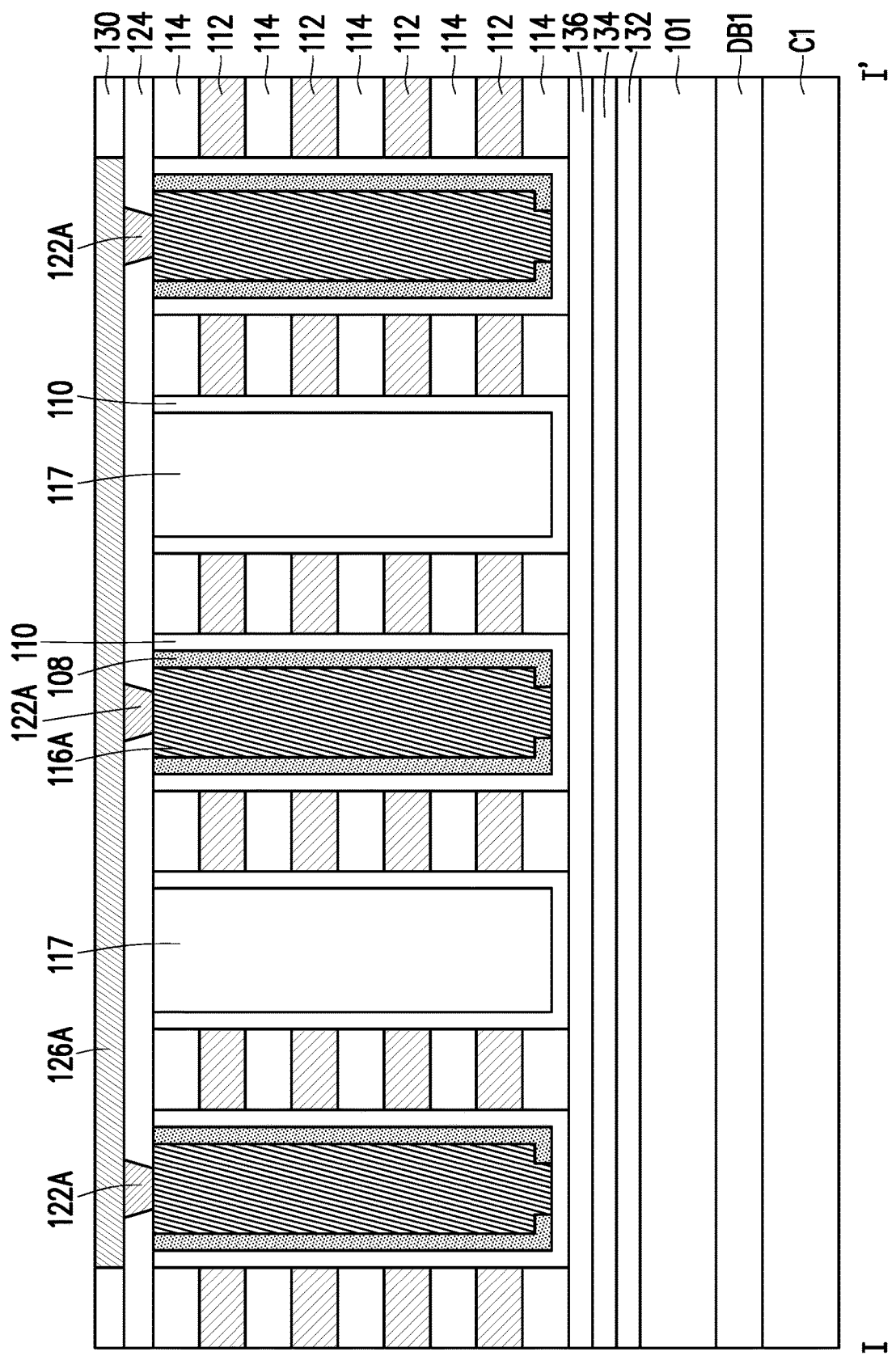
Figure 6C:
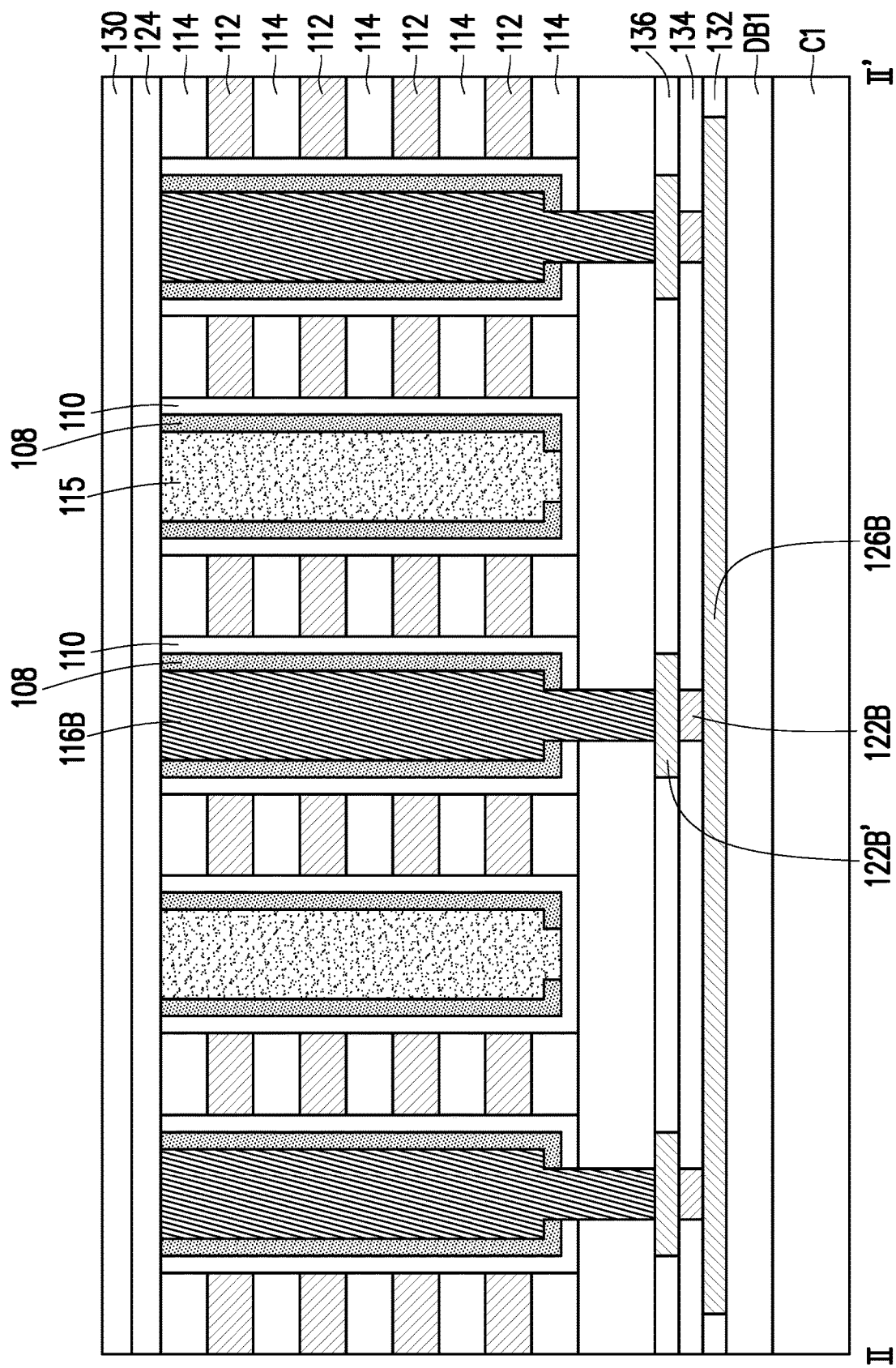

Referring to FIG. 6A, FIG. 6B and FIG. 6C, a memory 100 is formed over a carrier C1. The structure, the material and the forming process of the memory 100 are similar to those of the memory 100 as described with reference to FIG. 1A, FIG. 1B, FIG. 1C and FIG. 1D, and the main difference lies in the conductive lines 126A and the conductive lines 126B are formed at opposite sides (i.e., upper side and bottom side) of the staircase structures ST. For example, as shown in FIG. 6A and FIG. 6B, the conductive lines 126A are disposed over the staircase structures ST, and the conductive lines 126B are disposed below the staircase structures ST. In some embodiments, as shown in FIG. 6C, the conductive pillars 116B are extended into the etching stop layer 101, to electrically connect to the conductive lines 126B. Accordingly, the conductive contacts 122B, 122B' in dielectric materials 134, 136 are disposed between the conductive lines 126B and the conductive pillars 116B to electrically connect the conductive lines 126B and the conductive pillars 116B. The conductive lines 126B electrically connect the conductive pillars 116B in the same row, for example. In some embodiments, the conductive contacts 122B' are disposed between the conductive pillars 116B and the conductive contacts 122B. In alternative embodiments, one of the conductive contact 122B and the corresponding conductive contact 122B' is omitted, or the conductive contact 122B and the corresponding conductive contact 122B' are formed integrally. However, the disclosure is not limited thereto. The conductive lines 126B below the staircase structures ST may have other configurations. In some embodiments, the conductive lines 126A are bit lines, and the conductive lines 126B are source lines. In alternative embodiments, the conductive lines 126A are source lines, and the conductive lines 126B are bit lines.

The memory 100 may be formed by the following steps. First, the conductive lines 126B in a dielectric material 132 are formed over the de-bonding layer DB1, and the conductive contacts 122B and the conductive contacts 122B' are formed over the conductive lines 126B. For example, the conductive contacts 122B are formed in a dielectric material 134 and the conductive contacts 122B' are formed in a dielectric material 136. Then, the etching stop layer 101 is formed over the dielectric material 136. After that, the conductive lines 112, the conductive pillars 116A and the conductive pillars 116B may be formed over the etching stop layer 101. In some embodiments, the conductive pillars 116B are formed to extend into the etching stop layer 101 while the conductive pillars 116A are formed to stop on the top surface of the etching stop layer 101. Then, the conductive contacts 122A and the conductive contacts 122C may be formed in the dielectric material 124 to electrically connect to the conductive pillars 126A and the conductive contacts 118, respectively. After that, the conductive lines 126A and the conductive contacts 128 may be formed to electrically connect to the conductive contacts 122A and the conductive contacts 122C, respectively.

Figure 7A:
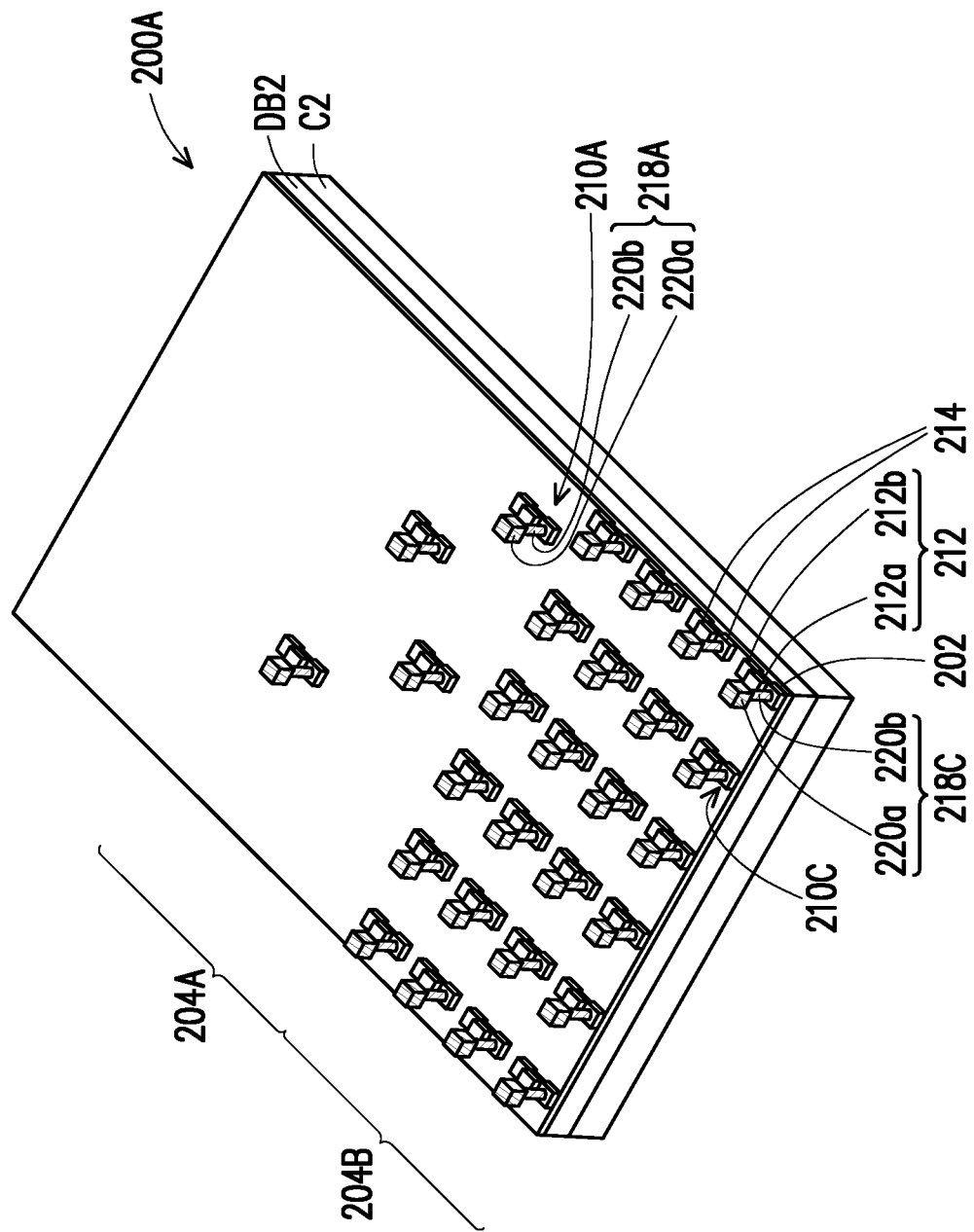
Figure 7B:
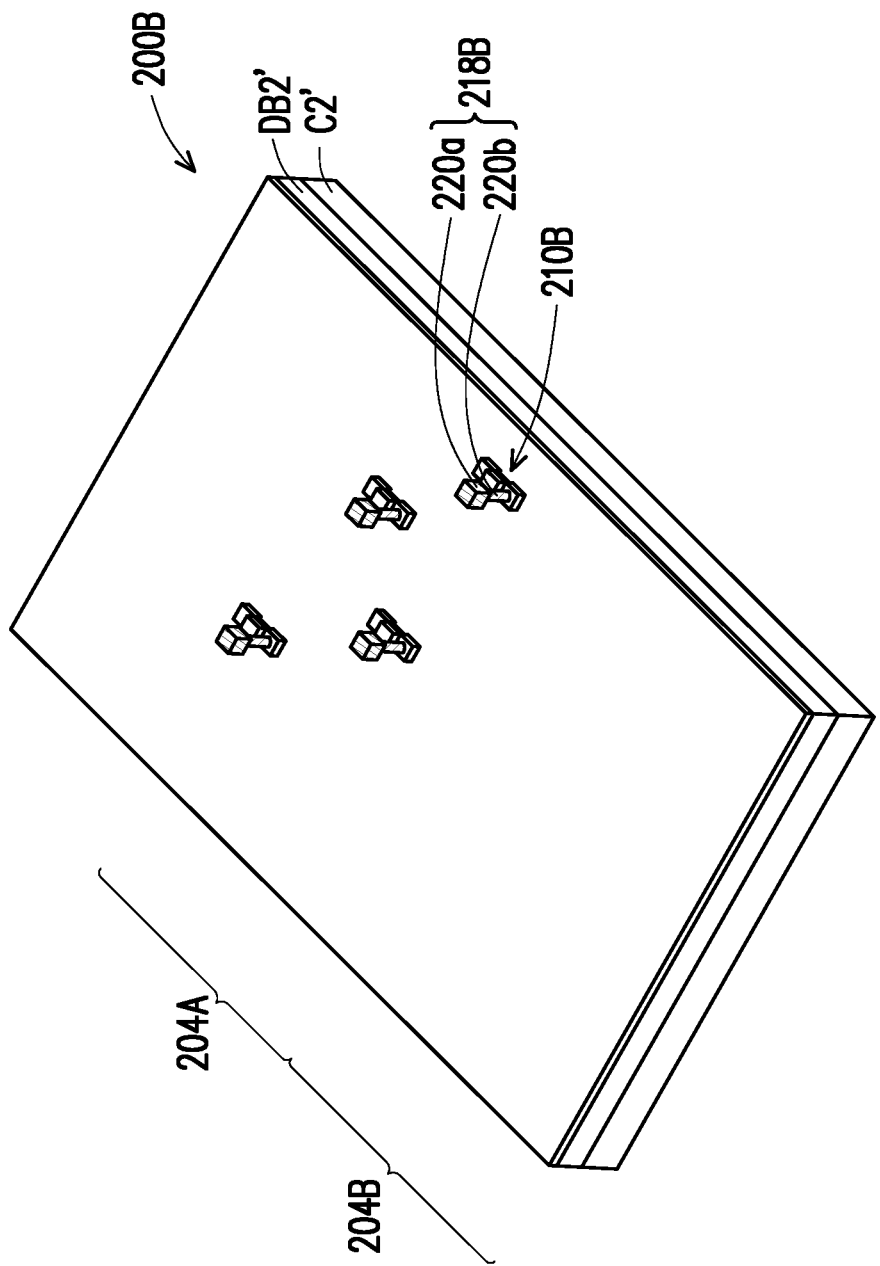

Referring to FIG. 7A and FIG. 7B, a circuit structure 200A is formed over a carrier C2, and a circuit structure 200B is formed over a carrier C2'. The circuit structure 200A may include a plurality of drivers 210A and a plurality drivers 210C. The circuit structure 200A may include a plurality of drivers 210B. The structure, the material and the forming process of the drivers 210A, 210B and 210C are similar to those of the drivers 210A, 210B and 210C as described with reference to FIG. 2B and FIG. 3B, and the main difference lies in the drivers 210B are formed over the carrier C2' different from the carrier C2 over which the drivers 210A and 210C are formed. In other words, the fabricating process of the drivers 210A and 210C and the fabricating process of the drivers 210B are separately performed.

Figure 8A:
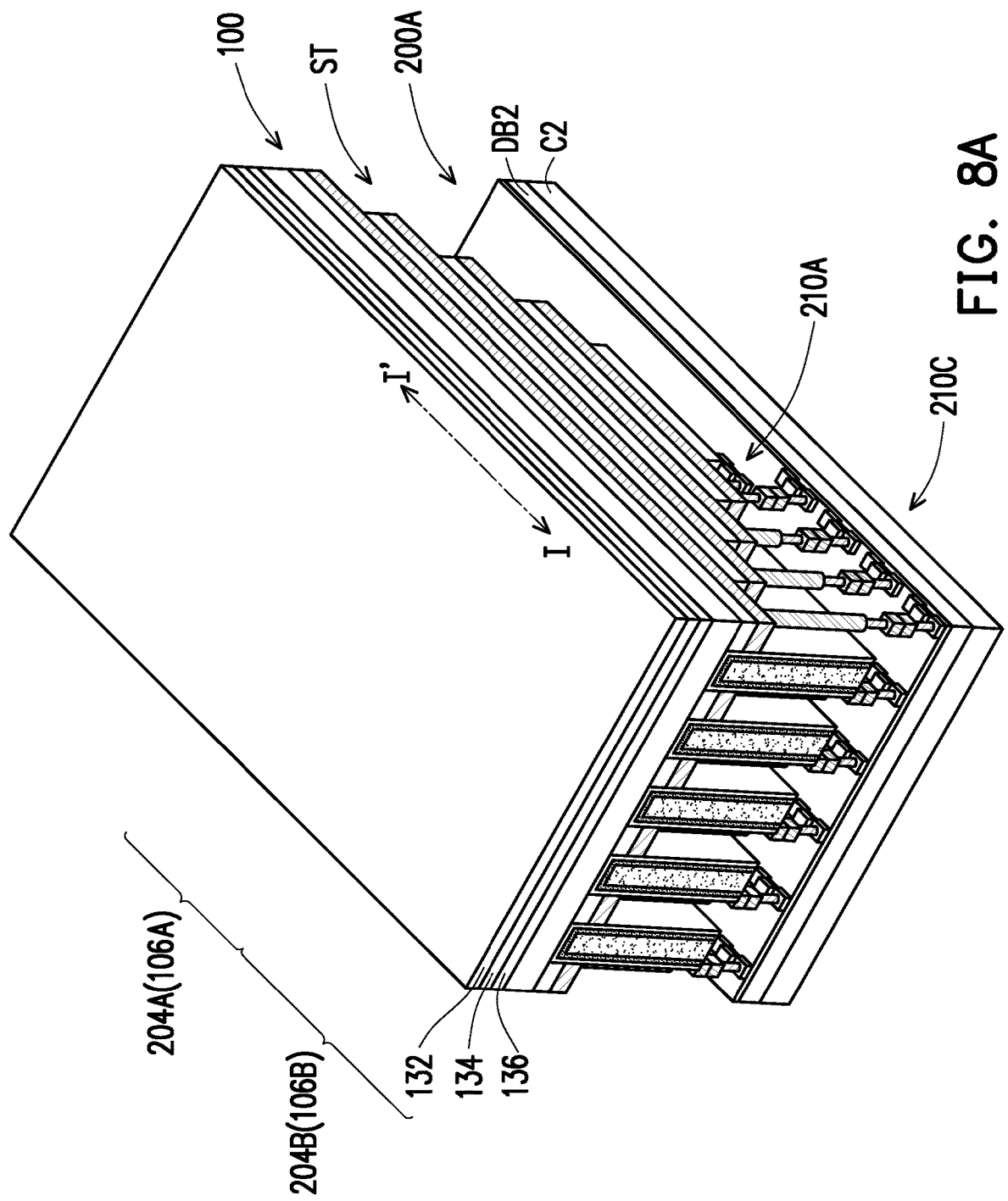
Figure 8B:
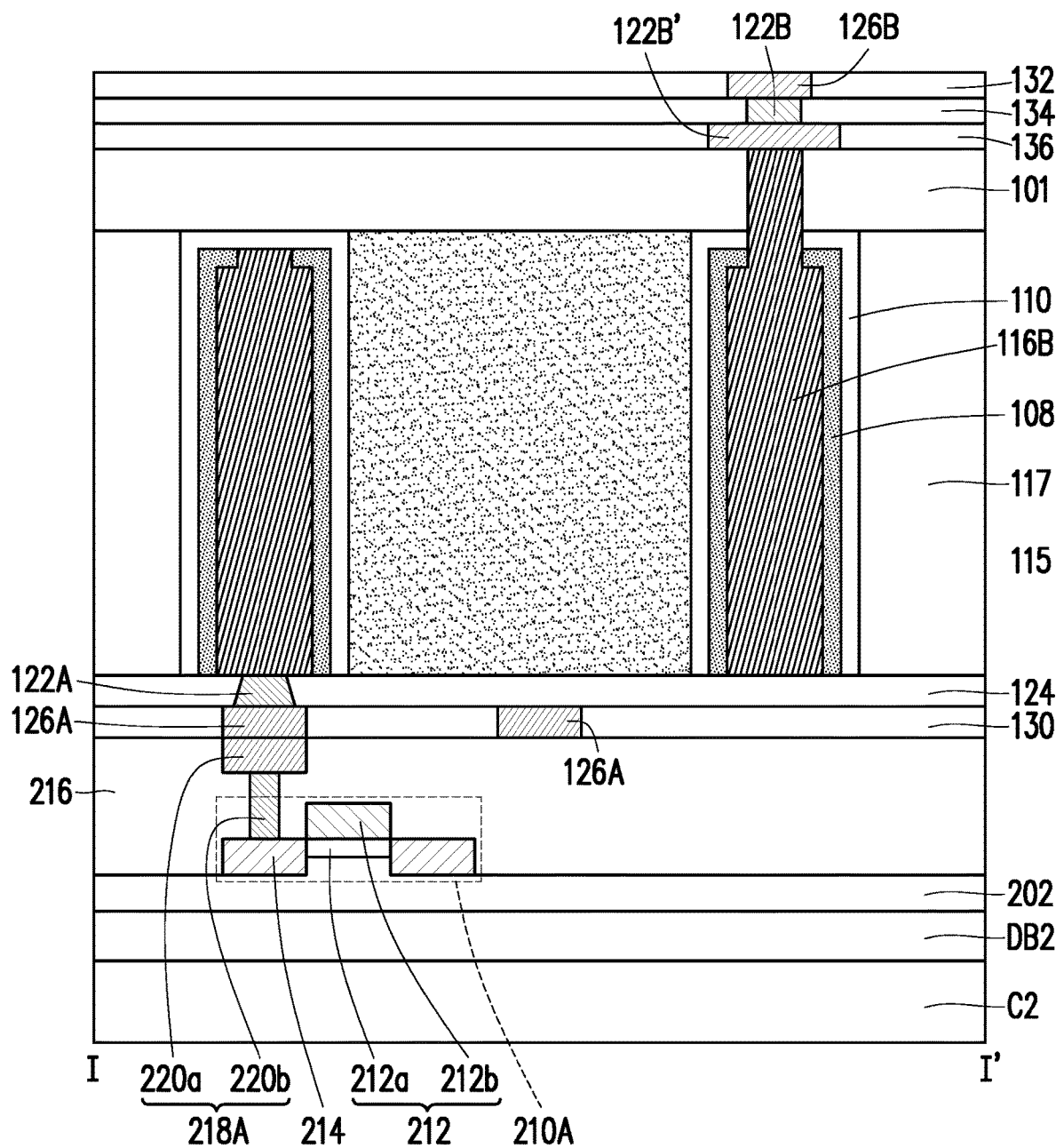

Referring to FIG. 8A and FIG. 8B, the memory 100 of FIG. 6A is bonded to one of the circuit structure 200A and the circuit structure 200B. In some embodiments, the memory 100 is de-bonded and separated from the carrier C1, and then the memory 100 is bonded to the circuit structure 200A over the carrier C2. The memory 100 is bonded onto the circuit structure 200A through a wafer to wafer bonding process, for example. In some embodiments, the conductive lines 126A are bonded to the conductive contacts 218A of the drivers 210A, and the conductive contacts 128 of the conductive lines 112 are bonded to the conductive contacts 218C of the drivers 210C, and the dielectric material 130 is bonded to the dielectric material 216. Accordingly, the conductive lines 126A are electrically connected to the drivers 210A, and the conductive lines 112 are electrically connected to the drivers 210C, respectively. In some embodiments, a reflow process may be performed. During the bonding process, a process temperature may be lower than 400° C. In some embodiments, a thinning process such as a grinding process is performed on the substrate 202 after de-bonding from the carrier C2, so as to reduce a total thickness of the formed structure.

Figure 9A:
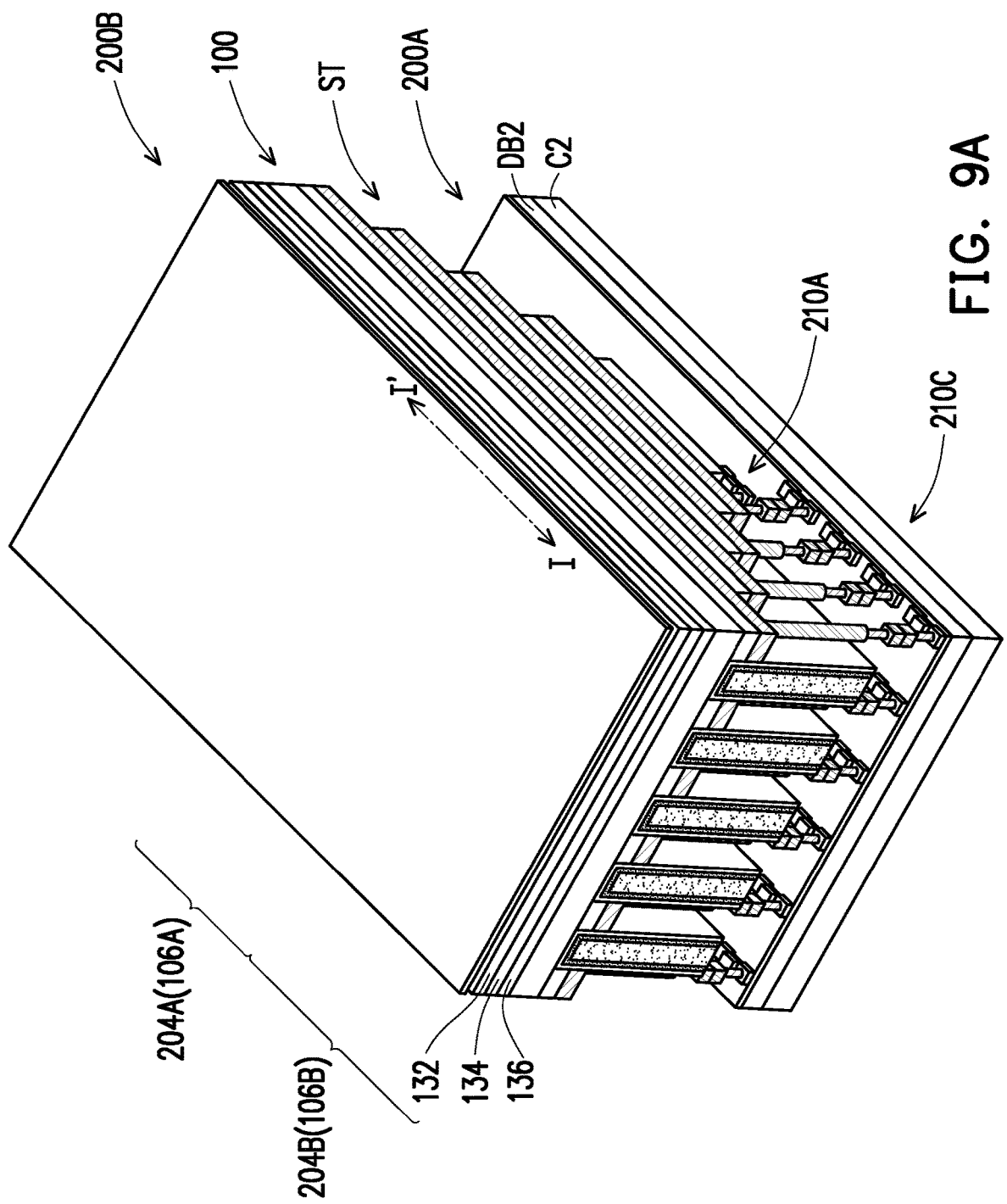
Figure 9B:
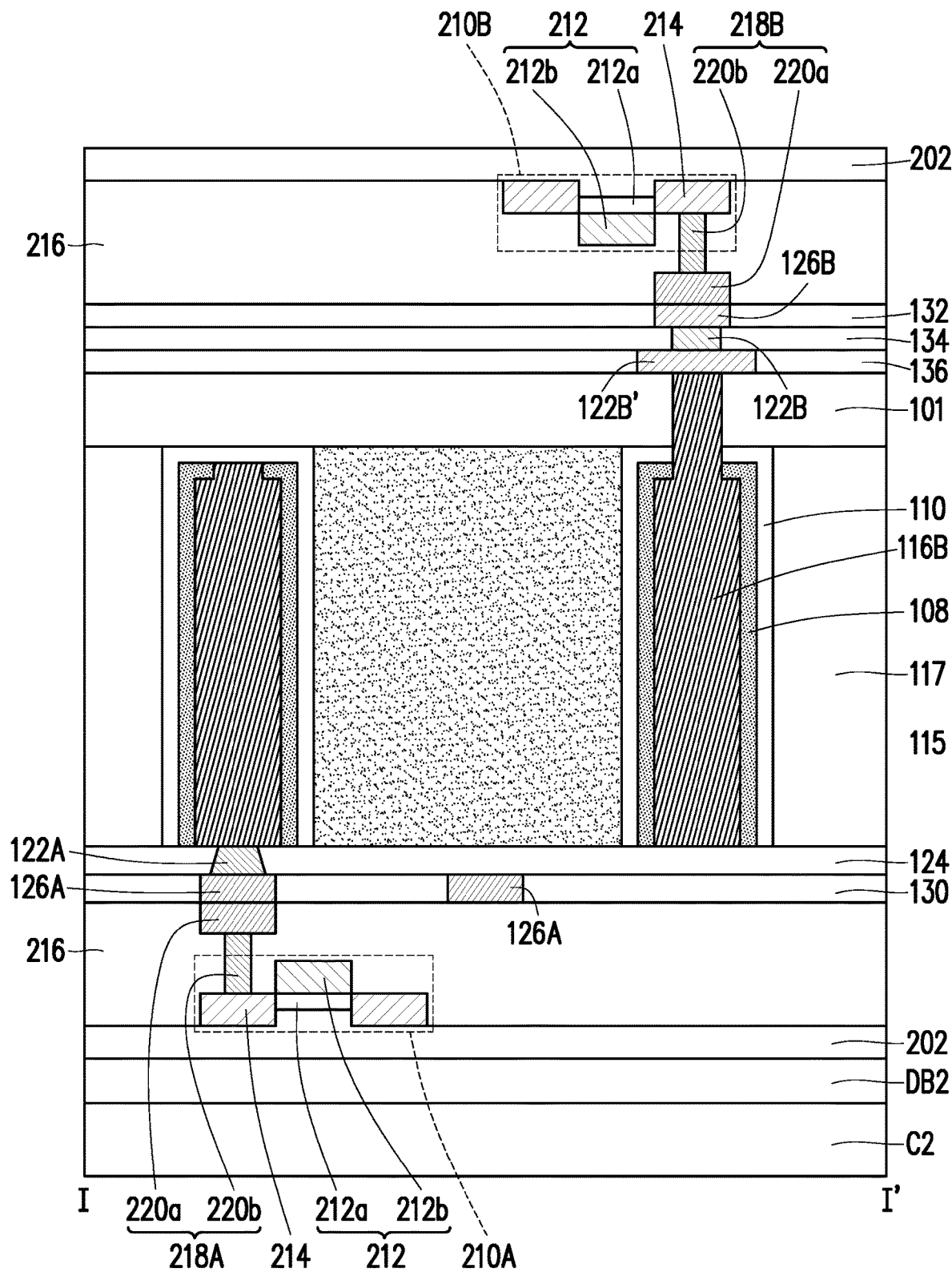

Referring to FIG. 9A and FIG. 9B, the circuit structure 200B is bonded to the resulting structure of FIG. 8A and FIG. 8B. In some embodiments, the circuit structure 200B is de-bonded and separated from the carrier C2', and then the circuit structure 200B is bonded to the memory 100 over the carrier C2. The circuit structure 200B is bonded onto the memory 100 through a wafer to wafer bonding process, for example. In some embodiments, the conductive contacts 218B of the drivers 210B are bonded to the conductive lines 126B, and a dielectric material 216 aside the conductive contacts 218B is bonded to the dielectric material 132 aside the conductive lines 126B. Accordingly, the conductive lines 126B are electrically connected to the drivers 210B, respectively. In some embodiments, a reflow process may be performed. During the bonding process, a process temperature may be lower than 400° C. In some embodiments, a thinning process such as a grinding process is performed on the substrate 202 after de-bonding from the carrier C2', so as to reduce a total thickness of the formed structure. In some embodiments, the circuit structure 200B is bonded to the memory 100 after bonding the circuit structure 200A onto the memory 100. In alternative embodiments, the circuit structure 200B is bonded to the memory 100 before bonding the circuit structure 200A onto the memory 100.

Figure 10A:
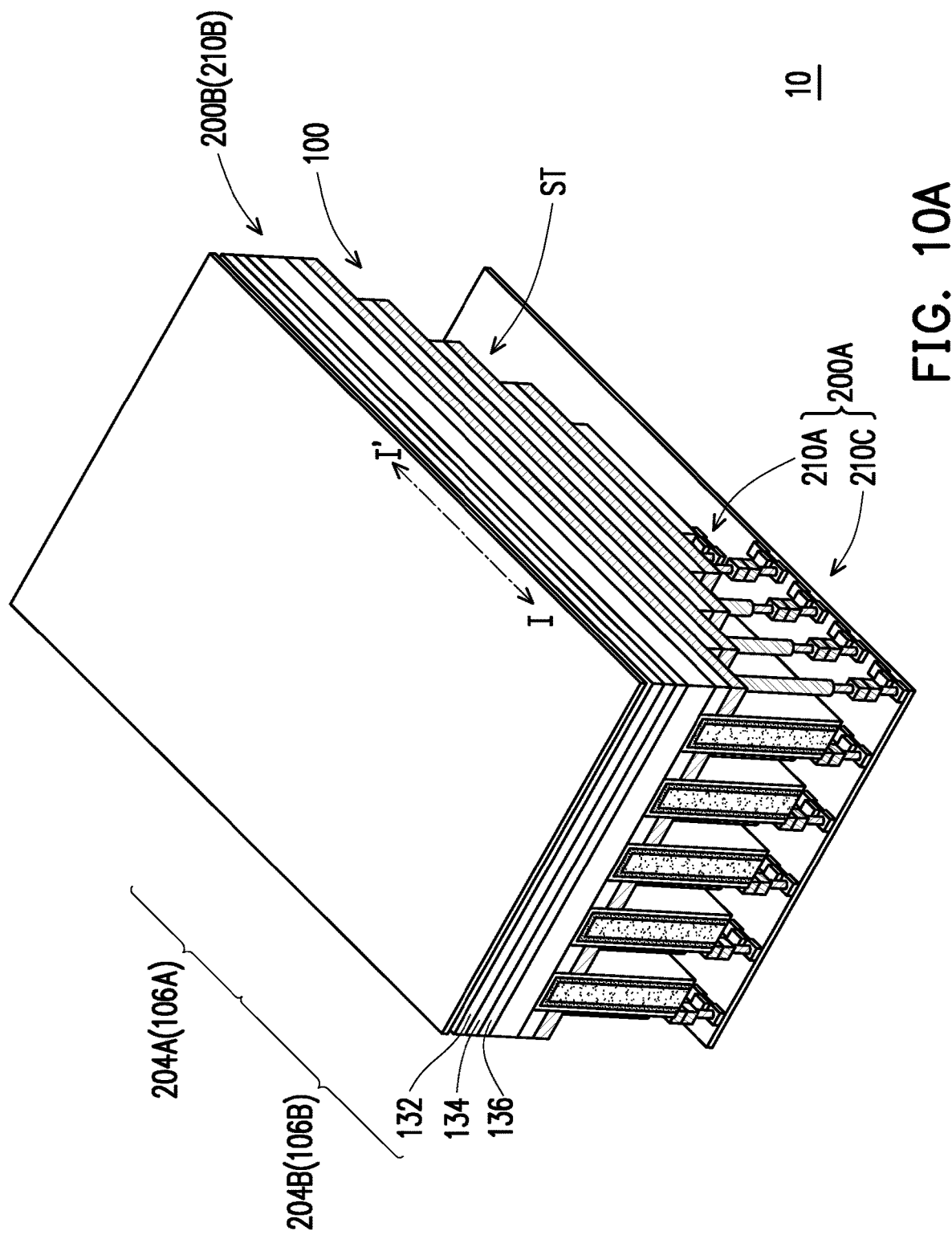
Figure 10B:
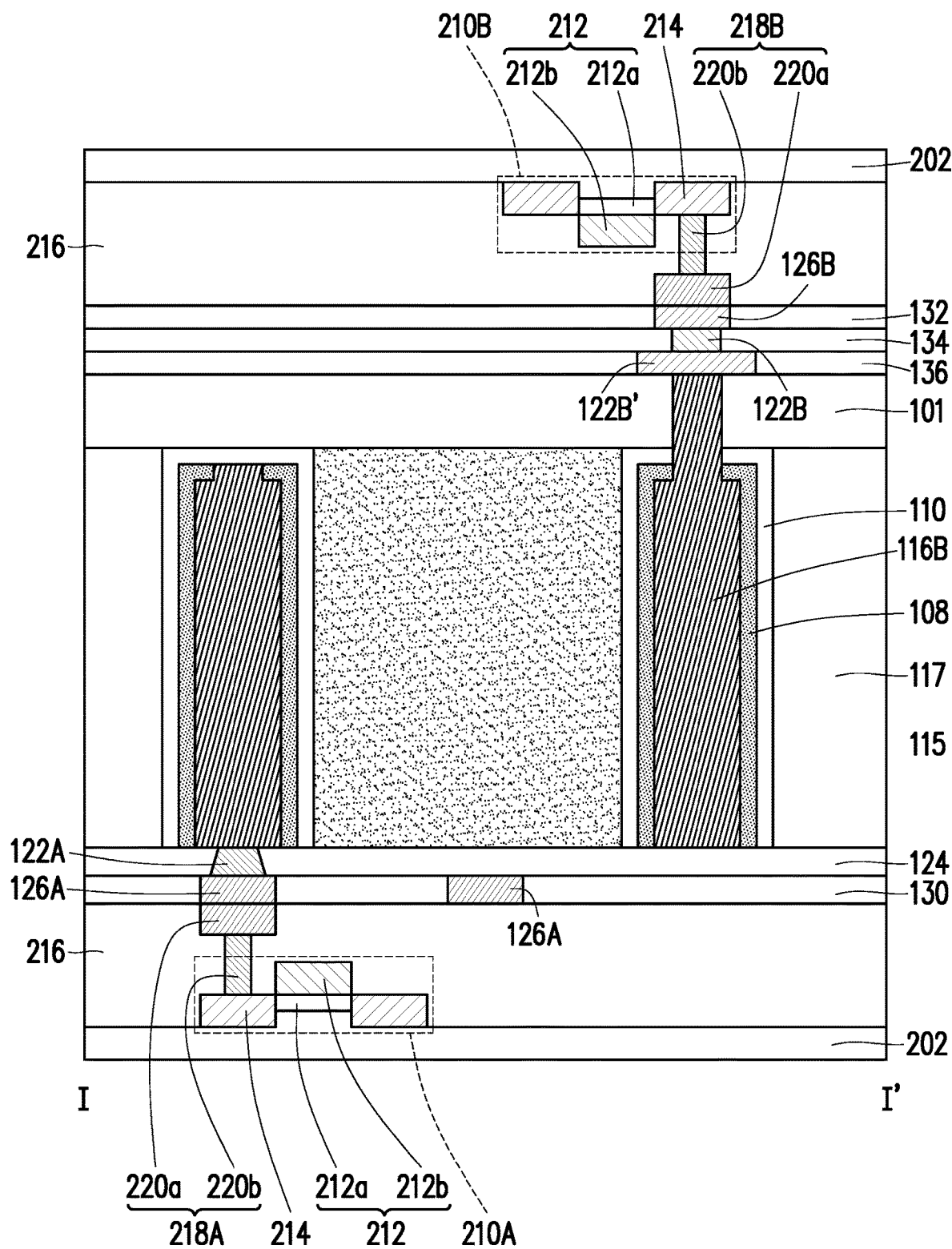

Referring to FIG. 10A and FIG. 10B, the formed structure of FIG. 9A and FIG. 9B is de-bonded from the carrier C1, to form a memory device 10. In some embodiments, the de-bonding process includes projecting a light such as a laser light or an UV light on the de-bonding layer DB1 (e.g., the LTHC release layer) so that the carrier C1 can be easily removed along with the de-bonding layer DB1. During the de-bonding step, a tape (not shown) may be used to secure the structure before de-bonding the carrier C1 and the de-bonding layer DB1.

In some embodiments, all drivers connecting to the same type of the conductive lines are formed over the same carrier. For example, the drivers 210A connecting to the conductive lines 126A are all formed over the carrier C2, the drivers 210B connecting to the conductive lines 126B are all formed over the carrier C2, and the drivers 210C connecting to the conductive lines 112 are all formed over the carrier C2'. However, the disclosure is not limited thereto. In alternative embodiments (not shown), drivers connecting to different type of the conductive lines are formed over the same carrier. That is, two of the driver 210A, driver 210B and the driver 210C may be formed over the same carrier.

Although the embodiments of FIG. 1A through FIG. 10B illustrate a particular pattern for the conductive pillars 116A and 116B, other configurations are also possible. For example, in these embodiments, the conductive pillars 116A and 116B have a staggered pattern. However, in other embodiments (not shown), the conductive pillars 116A and 116B in a same row of the array are all aligned with each other.

Figure 11A:
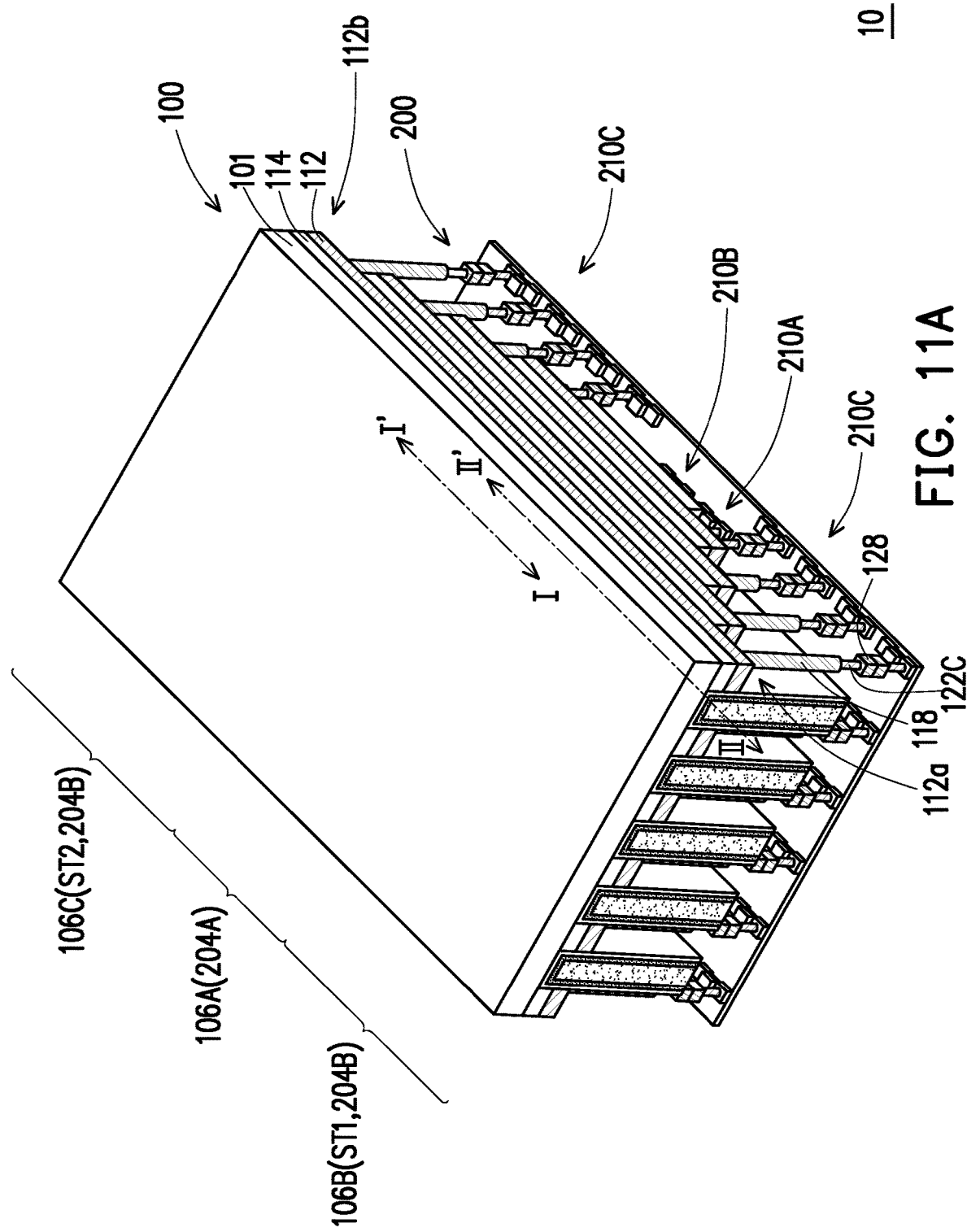
FIG. 11A and FIG. 11B illustrate varying views of a memory device in accordance with some embodiments.
Figure 11B:
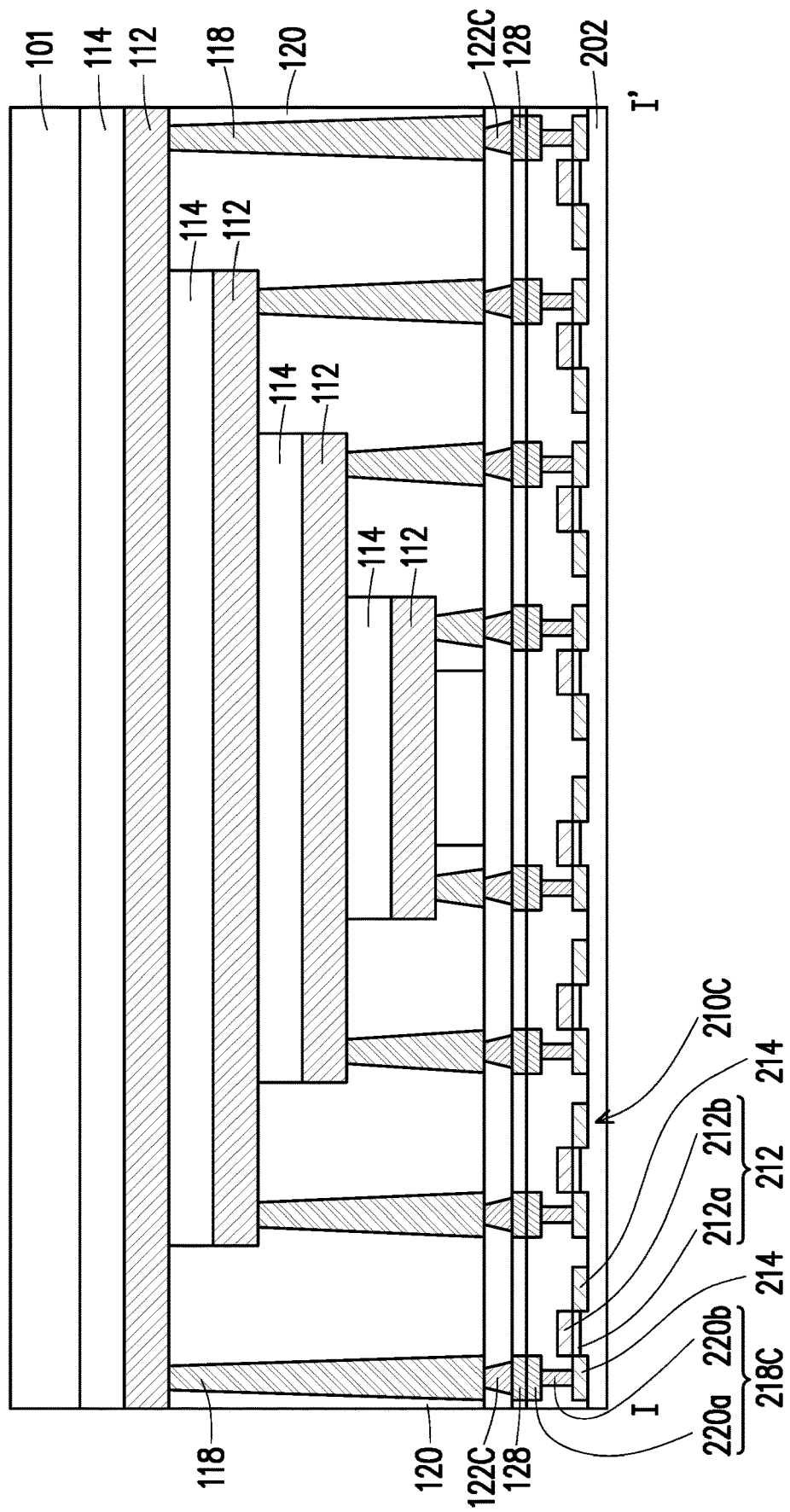

In above embodiments, the memory device is a single-sided driving structure, and the second region 204B corresponds to one of the staircase regions 106B and 106C. In some embodiments, as shown in FIG. 11A and FIG. 11B, the memory device 10 is a double-sided driving structure, the second regions 204B at opposite sides of the first region 204A correspond to the staircase region 106B and the staircase region 106C respectively. In such embodiments, the conductive contacts 118 are formed at both sides 112a and 112b of the conductive line 112, and the drivers 210C are disposed in both the second regions 204B to electrically connect the conductive contacts 118 respectively. In some embodiments, a number of the drivers 210C is doubled.

Figure 12:
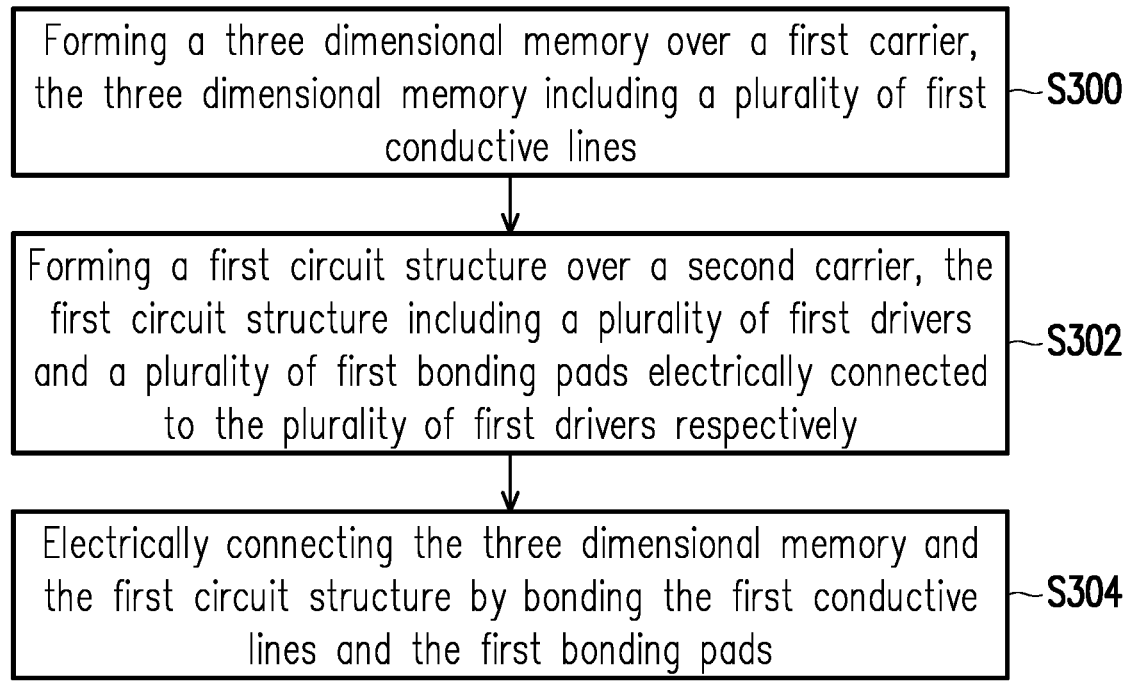
FIG. 12 illustrates a method of forming a memory device in accordance with some embodiments.

FIG. 12 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a three dimensional memory is formed over a first carrier, the three dimensional memory including a plurality of first conductive lines. FIGS. 1A, 1B, 1C, 1D, 6A and 6B, illustrate varying views corresponding to some embodiments of act S300.

At act S302, a first circuit structure is formed over a second carrier, the first circuit structure including a plurality of first drivers and a plurality of first bonding pads electrically connected to the plurality of first drivers respectively. FIGS. 2A, 2B, 2C, 7A and 7B illustrate varying views corresponding to some embodiments of act S302.

At act S304, the three dimensional memory and the first circuit structure are electrically connected by bonding the first conductive lines and the first bonding pads. FIGS. 3A, 3B, 3C, 5A, 5B, 5C, 8A, 8B, 9A and 9B illustrate varying views corresponding to some embodiments of act S304.

In some embodiments, the memory and the circuit structure are formed separately and then combined by bonding. Thus, the memory and the circuit structure may be formed under a desired condition thereof such as a desired process temperature, and one would not have an impact on the other. Accordingly, the performance of the formed memory device is improved.

In accordance with some embodiments of the present disclosure, a memory device includes a staircase structure, a plurality of first conductive contacts, a plurality of first drivers and a plurality of second conductive contacts. The staircase structure includes a plurality of first conductive lines and a plurality of first dielectric layers stacked alternately. The first conductive contacts are electrically connected to the plurality of first conductive lines respectively. The second conductive contacts are electrically connected to the plurality of first drivers respectively. The plurality of first conductive contacts and the plurality of second conductive contacts are bonded and disposed between the plurality of first conductive lines and the plurality of first drivers.

In accordance with alternative embodiments of the present disclosure, a memory device includes a staircase structure, a plurality of first drivers, a plurality of second conductive lines and a plurality of second drivers. The staircase structure has a first side and a second side opposite to the first side and includes a plurality of first conductive lines and a plurality of first dielectric layers stacked alternately along a direction from the first side to the second side. The first drivers are disposed at the first side of the staircase structure and electrically connected to the plurality of first conductive lines respectively. The second conductive lines are disposed at the second side and cross over the plurality of first conductive lines and the plurality of dielectric layers. The second drivers are disposed at the second side of the staircase structure and electrically connected to the second conductive lines respectively.

In accordance with yet alternative embodiments of the present disclosure, a method of forming a memory device includes following steps. A three dimensional memory is formed over a first carrier and the three dimensional memory includes a plurality of first conductive lines. A first circuit structure is formed over a second carrier, and the first circuit structure includes a plurality of first drivers and a plurality of first bonding pads electrically connected to the plurality of first drivers respectively. The three dimensional memory and the first circuit structure are electrically connected by bonding the plurality of first conductive lines and the plurality of the first bonding pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of staircase structures, one of the staircase structures comprising a plurality of first conductive lines and a plurality of first dielectric layers stacked alternately;
   memory material layers and channel layers, extending in between the staircase structures, and covering sidewalls of the staircase structures;
   conductive pillars, standing in between the staircase structures, and in lateral contact with the staircase structures through the memory material layers and the channel layers;
   a plurality of first conductive contacts electrically connected to the plurality of first conductive lines respectively;
   a plurality of first drivers; and
   a plurality of second conductive contacts electrically connected to the plurality of first drivers respectively, wherein the plurality of first conductive contacts and the plurality of second conductive contacts are bonded and disposed between the plurality of first conductive lines and the plurality of first drivers.

2. The memory device according to claim 1, wherein the plurality of first conductive contacts comprise a plurality of first bonding pads, the plurality of second conductive contacts comprise a plurality of second bonding pads, and the plurality of first bonding pads are bonded to the plurality of second bonding pads.

3. The memory device according to claim 1, wherein the plurality of first conductive contacts and the plurality of second conductive contacts are in direct contact, respectively.

4. The memory device according to claim 1, wherein one of the plurality of first drivers comprises a gate and a source and drain region, and one of the plurality of second conductive contacts is electrically connected to the source and drain region.

5. The memory device according to claim 1 further comprising a plurality of second conductive lines crossing over the plurality of first conductive lines and the plurality of dielectric layers.

6. The memory device according to claim 5 further comprising a plurality of second drivers and a plurality of third conductive contacts electrically connected to the plurality second drivers respectively, wherein the plurality of third conductive contacts are bonded to the plurality of second conductive lines and disposed between the plurality of second conductive lines and the plurality of second drivers.

7. The memory device according to claim 6, wherein surfaces of the third conductive contacts are substantially coplanar with surfaces of the second conductive contacts.

8. The memory device according to claim 1, wherein lengths of the plurality of first conductive lines decrease as the plurality of first conductive lines become closer to the plurality of first drivers.

9. The memory device according to claim 1, wherein the plurality of first drivers are disposed on a substrate, and the plurality of first conductive contacts and the plurality of second conductive contacts are disposed between the substrate and the staircase structures.

10. A method of forming a memory device, comprising:
forming a three dimensional memory over a first carrier, the three dimensional memory comprising a plurality of staircase structures, memory material layers, channel layers and conductive pillars, one of the staircase structures comprising a plurality of first conductive lines, a plurality of first dielectric layers stacked alternately and a plurality of first conductive contacts electrically connected to the plurality of first conductive lines respectively, the memory material layers and the channel layers extending in between the staircase structures and covering sidewalls of the staircase structures, and the conductive pillars standing in between the staircase structures and in lateral contact with the staircase structures through the memory material layers and the channel layers;
forming a first circuit structure over a second carrier, the first circuit structure comprising a plurality of first drivers and a plurality of second conductive contacts electrically connected to the plurality of first drivers respectively; and
electrically connecting the three dimensional memory and the first circuit structure by bonding the plurality of first conductive contacts and the plurality of second conductive contacts.

11. The method according to claim 10, wherein the plurality of first conductive contacts comprise a plurality of first bonding pads, and the plurality of second conductive contacts comprise a plurality of second bonding pads electrically connected to the plurality of first conductive lines respectively, and bonding the plurality of first conductive contacts and the plurality of second conductive contacts comprises bonding the plurality of first bonding pads and the plurality of second bonding pads between the plurality of first conductive lines and the plurality of first drivers.

12. The method according to claim 11, wherein the first circuit structure further comprises a second dielectric layer aside the plurality of second bonding pads, the three dimensional memory further comprises a third dielectric layer aside the plurality of second bonding pads, and bonding the plurality of first conductive contacts and the plurality of second conductive contacts further comprises bonding the second dielectric layer and the third dielectric layer.

13. The method according to claim 10, wherein the three dimensional memory further comprises a plurality of second conductive lines crossing over the plurality of first conductive lines, the first circuit structure further comprises a plurality of second drivers, and electrically connecting the three dimensional memory and the first circuit structure further comprises bonding the plurality of second conductive lines and the plurality of second drivers.

14. A memory device, comprising:
a staircase structure, comprising a plurality of first conductive lines and a plurality of first dielectric layers stacked alternately;
a plurality of first drivers electrically connected to the plurality of first conductive lines respectively;
a plurality of first conductive contacts electrically connected to the plurality of first conductive lines respectively; and
a conductive pillar, penetrating through the first conductive lines and the first dielectric layers, wherein the conductive pillar includes a metal pillar and a channel layer extended along a sidewall of the metal pillar.

15. The memory device according to claim 14, wherein a width of the plurality of first conductive contacts increases as the plurality of first conductive contacts become closer to the plurality of first drivers.

16. The memory device according to claim 14, wherein the plurality of first drivers comprises gates respectively, and the gates face the plurality of first conductive lines.

17. The memory device according to claim 14 further comprising a plurality of second conductive contacts physically connected to the plurality of first drivers and disposed between the plurality of first conductive lines and the plurality of first drivers, wherein the plurality of second conductive contacts respectively includes a first portion and a second portion between the first portion and the first drivers, the first portion is disposed between the second portion and the first conductive lines and has a width larger than the second portion.

18. The memory device according to claim 14 further comprising a plurality of second conductive lines crossing over the staircase structure, wherein the plurality of second conductive lines are disposed between the staircase structure and the plurality of first drivers.

19. The memory device according to claim 14 further comprising a plurality of second conductive lines and a plurality of second drivers electrically connected to the plurality of second conductive lines respectively, wherein the plurality of first drivers and the plurality of second drivers are disposed at a same side of the staircase structure.

20. The memory device according to claim 19, wherein surfaces of the second drivers are substantially coplanar with surfaces of the first drivers.

* * * * *